(12) United States Patent
Yamaji

(10) Patent No.: US 9,722,019 B2
(45) Date of Patent: Aug. 1, 2017

(54) HIGH VOLTAGE INTEGRATED CIRCUIT DEVICE

(71) Applicant: FUJI ELECTRIC CO., LTD., Kawasaki-shi (JP)

(72) Inventor: Masaharu Yamaji, Matsumoto (JP)

(73) Assignee: FUJI ELECTRIC CO., LTD, Kawasaki-Shi (JP)

(*) Notice: Subject to any disclaimer, the term of this patent is extended or adjusted under 35 U.S.C. 154(b) by 0 days.

(21) Appl. No.: 14/622,819

(22) Filed: Feb. 13, 2015

(65) Prior Publication Data

US 2015/0236013 A1     Aug. 20, 2015

(30) Foreign Application Priority Data

Feb. 19, 2014  (JP) .................................. 2014-029679
Jan. 6, 2015   (JP) .................................. 2015-000615

(51) Int. Cl.

| H01L 29/06   | (2006.01) |
| H01L 21/761  | (2006.01) |
| H01L 27/092  | (2006.01) |
| H03K 17/18   | (2006.01) |
| H03K 19/0185 | (2006.01) |
| H01L 21/8238 | (2006.01) |

(52) U.S. Cl.
CPC ........ *H01L 29/0634* (2013.01); *H01L 21/761* (2013.01); *H01L 27/0922* (2013.01); *H01L 29/0649* (2013.01); *H03K 17/18* (2013.01); *H03K 19/018571* (2013.01); *H01L 21/823878* (2013.01); *H03K 2217/0063* (2013.01)

(58) Field of Classification Search
CPC ............... H01L 29/0649; H01L 21/761; H01L 21/823878; H01L 29/0634; H01L 27/0922
See application file for complete search history.

(56) References Cited

U.S. PATENT DOCUMENTS

| 6,597,550    | B1 | 7/2003  | Chey et al.   |
| 2009/0085117 | A1 | 4/2009  | Harada et al. |
| 2010/0283116 | A1 | 11/2010 | Shimizu       |
| 2013/0001736 | A1 | 1/2013  | Yamaji        |

FOREIGN PATENT DOCUMENTS

| JP | 2001-025235    | A  | 1/2001  |
| JP | 2001-210972    | A  | 8/2001  |
| JP | 3346763        | B2 | 11/2002 |
| JP | 2008-301160    | A  | 12/2008 |
| JP | 2010-263116    | A  | 11/2010 |
| WO | WO-2012/176347 | A1 | 12/2012 |

*Primary Examiner* — Yu Chen
*Assistant Examiner* — Nilufa Rahim
(74) *Attorney, Agent, or Firm* — Rabin & Berdo, P.C.

(57) ABSTRACT

A high voltage integrated circuit device suppresses the quantity of holes that are implanted due to a negative voltage surge, thus preventing malfunction and destruction of a high side circuit. A p⁻-type aperture portion has a gap portion in an n-type well region that is a voltage resistant region, penetrating the n-type well region to reach a p-type substrate, so as to enclose an n-type well region that is a high potential region.

10 Claims, 23 Drawing Sheets

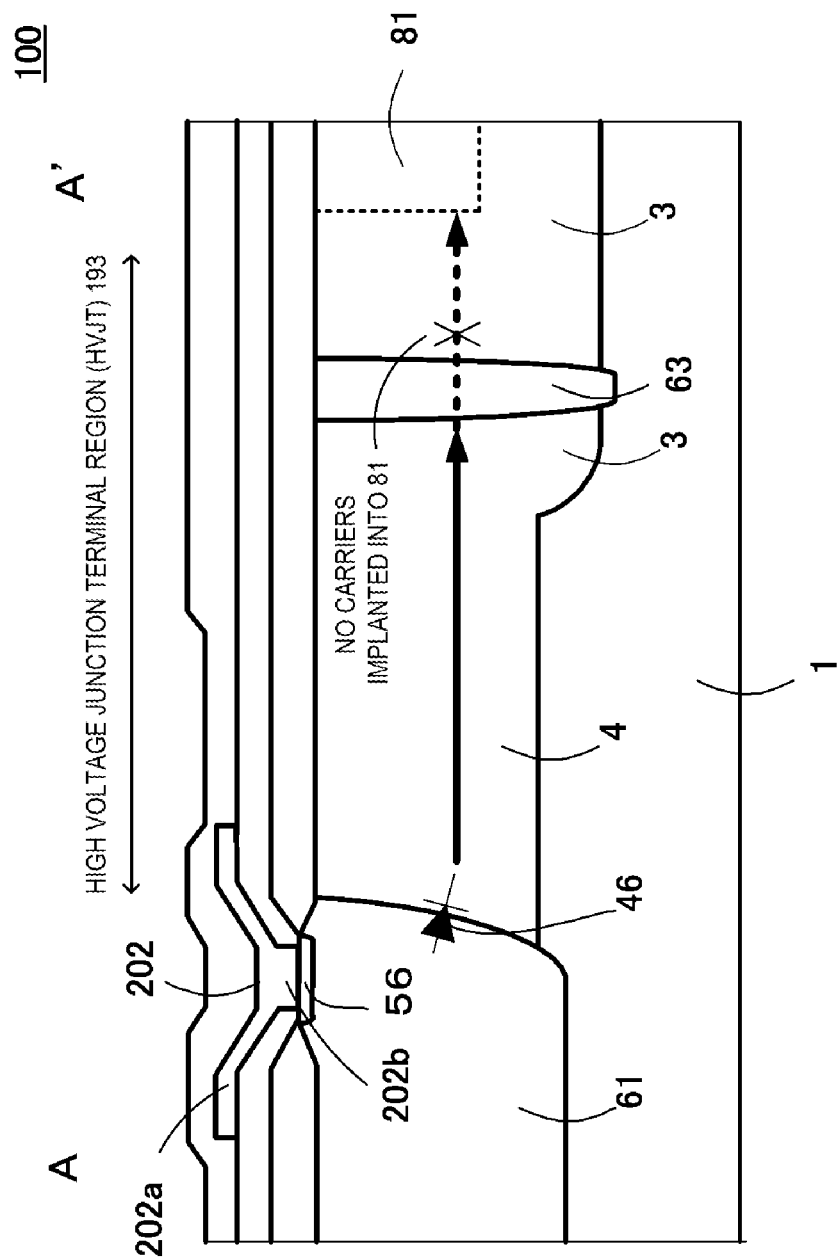

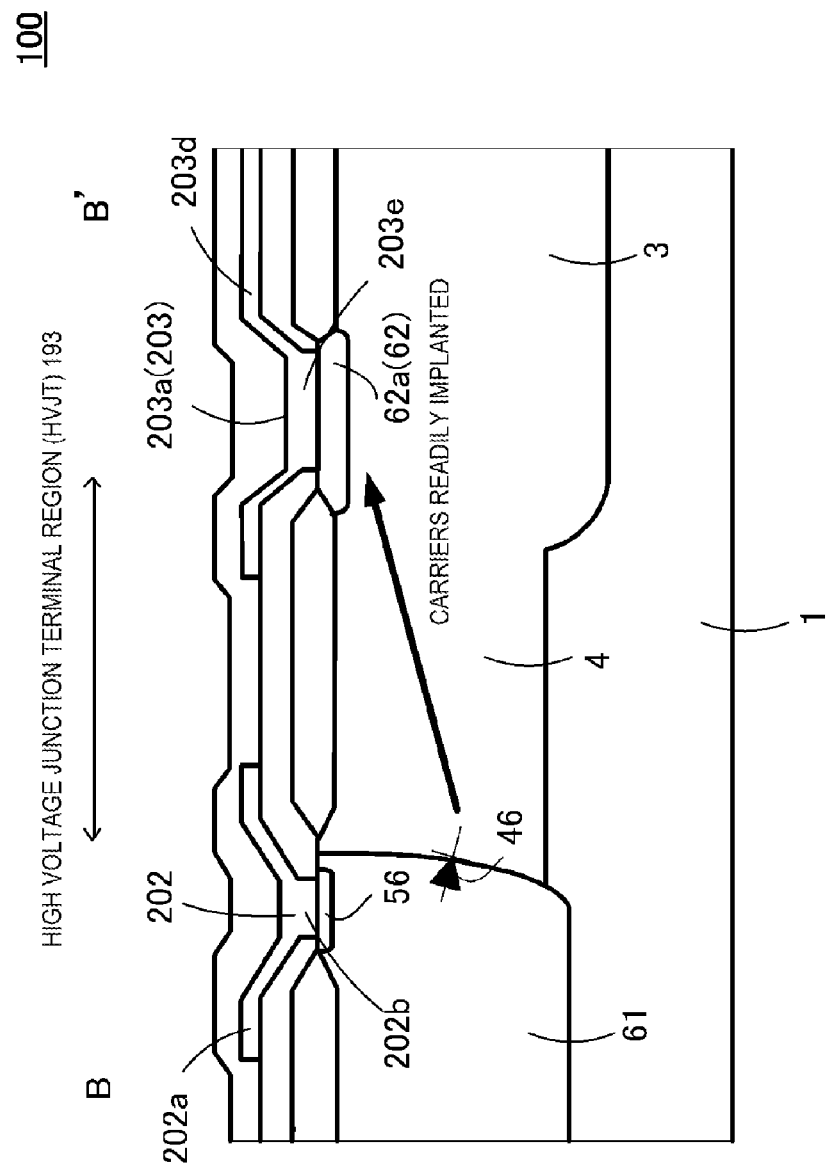

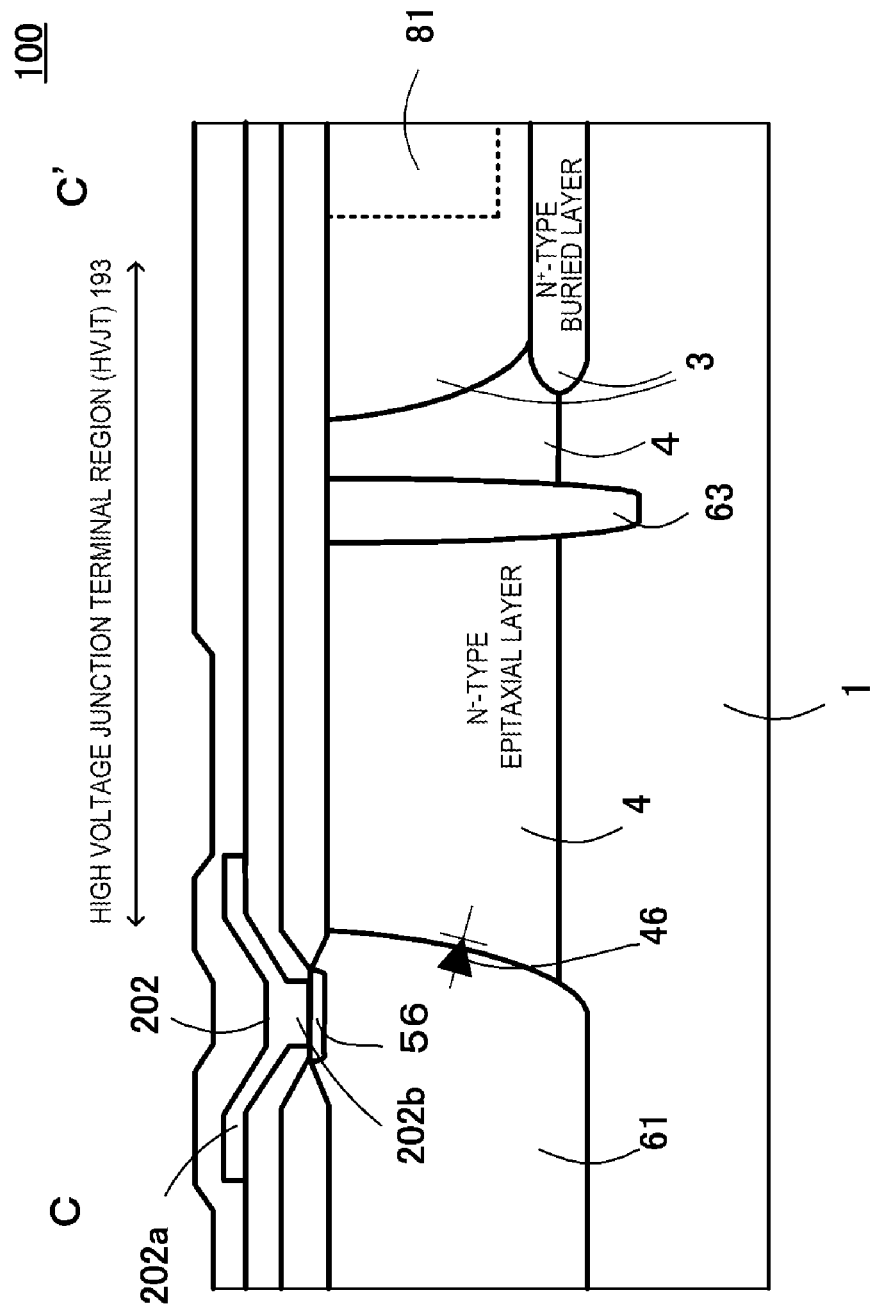

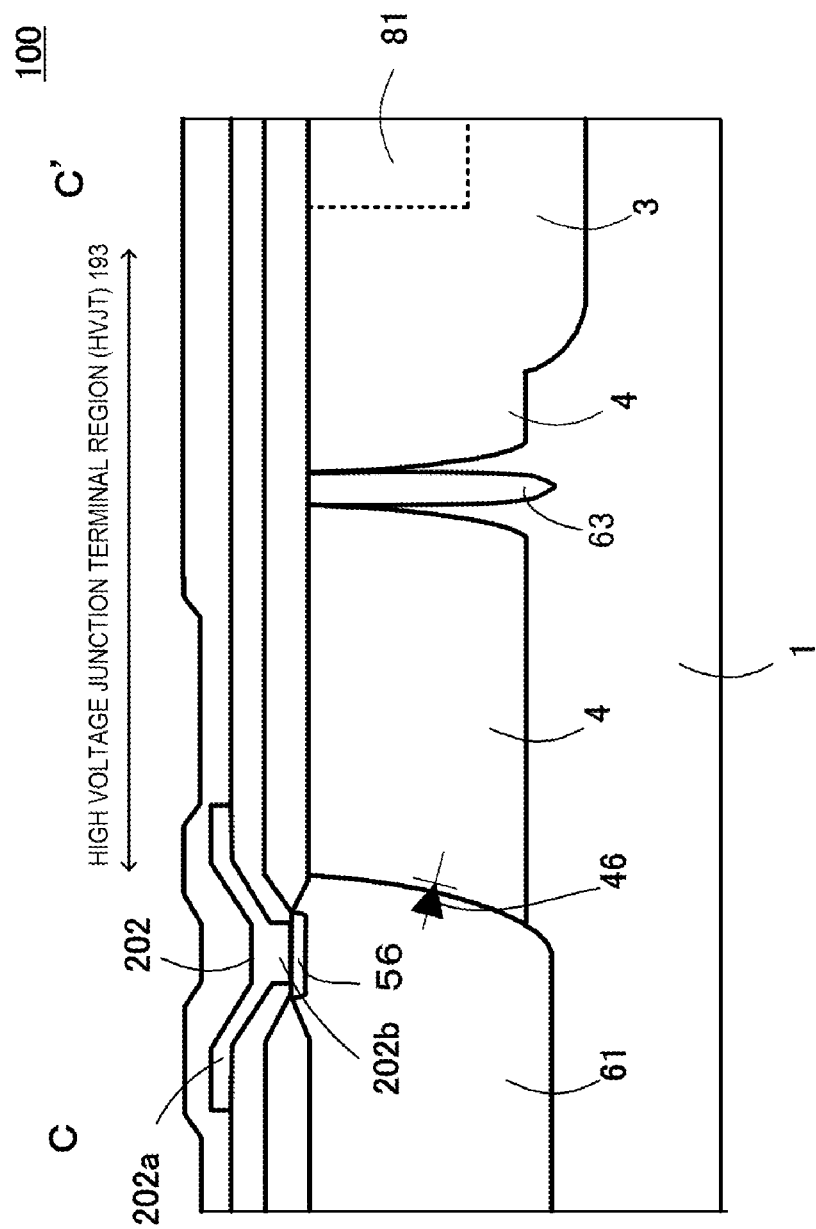

even HIGH VOLTAGE INTEGRATED CIRCUIT DEVICE

CROSS-REFERENCE TO RELATED APPLICATIONS

This application claims the benefit of foreign priority of Japanese patent applications 2014-029679, filed Feb. 19, 2014, and 2015-000615, filed Jan. 6, 2015. The disclosures of these Japanese priority applications are incorporated herein by reference.

BACKGROUND OF THE INVENTION

1. Field of the Invention

The present invention relates to a high voltage integrated circuit device (HVIC). In particular, the invention relates to a high voltage integrated circuit device such that malfunction due to an overcurrent flowing when a negative voltage surge is input into a circuit is prevented from occurring.

2. Description of the Background Art

An element isolation type of HVIC that utilizes a high breakdown voltage junction is used in a method of driving a switching power device configuring the upper arm of a power conversion (direct current to alternating current conversion) bridge circuit such as a PWM inverter. The HVIC has increased functionality, including the functions of overcurrent detection and temperature detection when trouble occurs in the switching power device, and there is no carrying out of electrical isolation by a transformer, photocoupler, or the like, because of which it is possible to achieve a reduction in size and a reduction in cost of a power supply system.

FIG. 7 is an illustration showing an example of the connection of a switching power device of a power conversion device, such as an inverter, and an existing HVIC that drives the switching power device. FIG. 7 shows an example of a half-bridge wherein two switching power devices (herein, IGBTs 114 and 115) are connected in series. The power conversion device shown in FIG. 7 is such that a high potential and low potential are output alternately from a Vs terminal, which is an output terminal, by the upper arm IGBT 115 and lower arm IGBT 114 being turned on alternately, thereby supplying alternating current power (causing alternating current to flow) to an L load 118.

That is, when outputting a high potential, the IGBT 114 and IGBT 115 are caused to operate so that the upper arm IGBT 115 is turned on and the lower arm IGBT 114 is turned off. Also, conversely, when outputting a low potential, the IGBT 114 and IGBT 115 are caused to operate so that the upper arm IGBT 115 is turned off and the lower arm IGBT 114 is turned on. Diodes connected in anti-parallel to the IGBTs 114 and 115 are free wheeling diodes (FWD) 116 and 117. In this period, in an HVIC 111 that is a drive element, a gate signal to the lower arm IGBT 114 is such that the signal is output using a GND reference, and a gate signal to the upper arm IGBT 115 is such that the signal is output using a Vs terminal reference. Therefore, it is necessary that the HVIC 111 includes a level shift function.

Of the reference signs in FIG. 7, Vss is the high potential side of a high voltage power supply, which is a main circuit power supply. GND is the ground. Vs is an intermediate potential that fluctuates between the Vss potential and GND potential. H-VDD is the high potential side of a second low voltage power supply 113 having Vs as a reference. L-VDD is the high potential side of a first low voltage power supply 112 having GND as a reference. When the second low voltage power supply 113 is a bootstrap circuit type, it is configured of an external capacitor (not shown) charged by an external bootstrap diode (not shown) connected between the L-VDD and H-VDD.

Also, H-IN is an input signal input into the gate of a low side C-MOS circuit connected to a level-up circuit, and an input terminal. L-IN is an input signal input into the gate of a low side C-MOS circuit connected to the gate of the lower arm IGBT 114, and an input terminal. Also, H-OUT is a high side C-MOS circuit output signal output to the gate of the upper arm IGBT 115, and an output terminal. L-OUT is an output signal output to the gate of the lower arm IGBT 114, and an output terminal. Also, ALM-IN is an input signal of a detection signal 119 when the temperature or an overcurrent of the upper arm IGBT 115 is detected, and an input terminal. ALM-OUT is an output signal of a detection signal of which the level has been lowered, and an output terminal.

FIGS. 8 and 9 are circuit diagrams showing level shifter circuits inside the HVIC 111 shown in FIG. 7, and circuits peripheral to the level shifter circuits. FIG. 8 is a circuit diagram including a level-up circuit, while FIG. 9 is a circuit diagram including a level-down circuit. In FIGS. 8 and 9, reference number 120 is a high potential side terminal of the second low voltage power supply 113 shown in FIG. 7, which has the intermediate potential Vs as a reference.

Herein, a low side C-MOS circuit that transmits input signals of the level shifter circuit, and a high side C-MOS circuit that transmits output signals of the level shifter circuit to the upper arm IGBT 115, are shown as the peripheral circuits. In the following description, p indicates p-type and n indicates n-type.

In FIG. 8, on an input signal (H-IN) being input into the low side circuit, the signal is input via the C-MOS circuit of the low side circuit into the gate of an n-channel MOSFET 41 of the level-up circuit. The n-channel MOSFET 41 is turned on or off by this signal, an output signal of the level-up circuit is output from an output portion 101, the C-MOS circuit of the high side circuit is turned on or off in accordance with the signal, and an output signal (H-OUT) is output. The output signal is converted into a signal having the intermediate potential Vs as a reference. The output signal is input into the gate of the upper arm IGBT 115, thereby causing the upper arm IGBT 115 to be turned on or off. The level-up circuit of FIG. 8 is necessary when the upper arm IGBT 115 is an n-channel type.

In FIG. 9, the level-down circuit is configured of a p-channel MOSFET 43 and a level shift resistor 72. A diode 76 is connected in parallel with the level shift resistor 72. The ALM-IN signal is input into the gate of the C-MOS circuit of the high side circuit, and an output signal of the C-MOS circuit is input into the gate of the p-channel MOSFET 43 of the level-down circuit. By the p-channel MOSFET 43 being turned on or off, a low side signal is output from an output portion 102 of the level-down circuit, and a signal of which the level has been lowered from the output of the C-MOS circuit of the low side circuit is output as a detection signal from ALM-OUT to the low side.

As well as in motor control inverters, switching power devices are widely utilized in a large number of fields, such as power supply applications for large capacity plasma display panels (PDP), liquid crystal panels, and the like, and inverters for household electrical appliances such as air conditioners and lighting, and as well as IGBTs, power MOSFETs are also used.

Motors, lighting, and the like, form the kind of inductance load shown in FIG. 7. Therefore, the Vs terminal and H-VDD terminal of the HVIC are affected by parasitic inductance, or the like, caused by wiring on a printed substrate, cable to the load, or the like. Due to the parasitic inductance, the Vs terminal and H-VDD terminal of the HVIC 111 fluctuate to the negative potential side with respect to the ground (the GND terminal of FIG. 7) when the upper arm IGBT 115 is turned off. This fluctuation causes element destruction due to malfunction or latch-up of the high side circuit.

FIGS. 10A and 10B are detailed diagrams of the level shifter circuit of the existing HVIC. FIG. 10A is a level-up circuit diagram, and FIG. 10B is a level-down circuit diagram.

The level-up circuit shown in FIG. 10A is configured to include a level shift resistor 71 and the n-channel MOSFET 41, of which the drain is connected to the level shift resistor 71, wherein a connection portion of the level shift resistor 71 and n-channel MOSFET 41 is adopted as the output portion 101 of the level-up circuit.

When the H-VDD is of a potential considerably lower than the GND potential (when an excessive negative voltage surge is applied) as heretofore described, a diode 75 is connected in parallel with the level shift resistor 71 in order to prevent thermal destruction of the level shift resistor 71. Also, when an overvoltage is applied to the H-VDD, the diode 75 has a function of preventing an excessive voltage from being applied to the gate of the MOSFET of the high side circuit C-MOS circuit. Normally, a Zener diode is used as the diode 75. Also, a body diode 42 is incorporated in anti-parallel with the n-channel MOSFET 41.

Meanwhile, the level-down circuit shown in FIG. 10B is configured to include the drain of the p-channel MOSFET 43 and the level shift resistor 72 connected to the drain, wherein a connection portion of the level shift resistor 72 and p-channel MOSFET 43 is adopted as the output portion 102 of the level-down circuit.

When the H-VDD is of a potential considerably lower than the GND potential, the diode 76 is connected in parallel with the level shift resistor 72 in order to prevent thermal destruction of the level shift resistor 72. Also, when an overvoltage is applied to the H-VDD when the p-channel MOSFET 43 carries out a turn-on operation, the diode 76 has a function of preventing an overvoltage from being applied to the gate of the MOSFET of the low side circuit C-MOS circuit. Also, the diode 76 has a function of preventing an overvoltage from being applied to the H-VDD when the p-channel MOSFET 43 carries out a turn-on operation. Also, a body diode 44 is connected in anti-parallel with the p-channel MOSFET 43.

FIG. 11 is sectional views showing logic portions of a high side circuit and low side circuit of an existing self-isolation type of high voltage integrated circuit device 500, and main portions of a level-up circuit portion and high voltage junction terminal region (HVJT). Reference sign 21 in FIG. 11 is a p-type offset region. Reference signs 22 to 24, 26 to 28, 32 to 34, and 36 to 38 in FIG. 11 are regions that form sources, drains, and contacts. Also, reference signs 25, 29, 35, and 39 are gate electrodes. Although not shown, a gate oxide film is formed between each gate electrode and a substrate 1. Also, although not shown, an interlayer dielectric and protective film are formed on the gate oxide film.

In FIG. 11, an n-type well region 2 and an n-type well region 3 are formed in a surface layer of the p-type substrate 1, which is connected to a GND potential. For example, a C-MOS circuit, or the like, of the low side circuit is formed inside the n-type well region 2. For example, a C-MOS circuit, or the like, of a level shifter circuit or the high side circuit is formed inside the n-type well region 3.

The level shifter n-channel MOSFET 41 includes an n⁻-type well region 4 that forms a voltage resistant region, a p-type well region 51 in contact with the n⁻-type well region 4, an n-type source region 53 and p-type contact region 56 formed in a surface layer of the p-type well region 51, an n-type drain region 52 formed in a surface layer of the n⁻-type well region 4, and a gate electrode 55 formed across a gate oxide film (not shown) on the p-type well region 51 sandwiched by the n-type source region 53 and n-type drain region 52.

The n-type drain region 52 of the n-channel MOSFET 41 is connected by surface metal wiring to the H-VDD via the level shift resistor 71. The high voltage integrated circuit device 500 is such that a connection portion of the n-type drain region 52 of the n-channel MOSFET 41 and the level shift resistor 71 is adopted as the output portion 101 of the level-up circuit.

The output portion 101 outputs a low potential when the level-up n-channel MOSFET 41 is turned on, and outputs a high potential when the n-channel MOSFET 41 is turned off. Therefore, the high voltage integrated circuit device 500 can carry out a level shift operation, which is a signal transmission between differing reference potentials.

As heretofore described, a surge of negative potential with respect to the GND potential enters the Vs terminal at the timing at which the upper arm IGBT 115 is turned off. This intermediate voltage Vs can be calculated using the following Expression 1.

$$Vs = L \times dI/dt \quad (1)$$

When the intermediate voltage Vs becomes lower than a value which is the value of Vsupply and Vf added together subtracted from the GND potential, an internal parasitic diode of the semiconductor chip begins to conduct. Vsupply is the battery voltage across the second low voltage power supply 113 or an unshown bootstrap capacitor, and Vf is the forward voltage drop of parasitic diodes 45 and 46.

When the intermediate voltage Vs is pulled a long way in the negative direction, an overcurrent flows through the chip, as a result of which there is concern that the high side circuit will malfunction, and the chip be damaged. For the period for which there is negative voltage, a spike form negative surge is applied to the Vs terminal at in the region of, for example, −30V for a period of around several hundred nanoseconds to in the region of 500 nanoseconds, in proportion to the product of parasitic inductance (L1) caused by wiring on the printed substrate from the HVIC 111, cable to the load, and the like, and dI1/dt in an off-state period of an on-state current I1 caused to flow through the IGBT 115.

FIG. 12 is a deployment diagram showing main portions of the high side circuit, level shifter, and the like, of FIG. 11. An H-VDD pad, H-OUT pad, Vs pad and intermediate potential region are formed in the n-type well region 3, which is a high potential region. A Vs potential region 81, which is an intermediate potential region, is a p-type offset region 31 and the p-type drain region 34 of FIG. 11. A second high concentration region 62, which is an n-type contact region, is formed in band-form in a surface layer on the outer periphery of the n-type well region 3. A second pickup electrode 203 is disposed on the second high concentration region 62. The n⁻-type well region 4, which is a voltage resistant region, is formed enclosing the n-type well region 3. A p-type common potential region 61 is formed enclosing the n⁻-type well region 4. An H-VDD potential region 82 is a region in which are formed the n-type contact region 32, p-type source region 33, and the like, shown in FIG. 11.

Also, a first high concentration region 56, which is a p-type contact region, is formed in band-form in a surface layer of the p-type common potential region 61. A first pickup electrode 202 is disposed on the first high concentration region 56. Herein, for the sake of convenience, the first and second pickup electrodes 202 and 203 are shown as dotted black squares.

The dotted black squares represent metals that fill unshown contact holes, formed in an interlayer dielectric and a protective film, that link the pickup electrodes 202 and 203 and the first and second high concentration regions 56 and 62.

An n-type well region 2, which is a low potential region, is formed in contact with the p-type common potential region 61 and enclosing the p-type common potential region 61. The GND reference low side circuit shown in FIG. 11 is formed in the n-type well region 2. The p-type well region 51 is formed in a surface layer of the p-type substrate 1 sandwiched between the n-type well region 2 and n$^-$-type well region 4. The n-channel MOSFET 41 of the level shifter is formed in a surface layer of the p-type well region 51. Also, a high voltage junction terminal region (HVJT) is configured of the second high concentration region 62 and p-type common potential region 61 and the n$^-$-type well region 4 sandwiched between these regions. The p-type well region 51 and n$^-$-type well region 4 in which the level shifter is formed are in contact.

When attempting to reduce the chip size by disposing each of the previously described regions efficiently and without waste, one portion of the Vs potential region 81, which is an intermediate potential region, is disposed adjacent to the second high concentration region 62. When taking the place of the adjacent portion to be reference sign E (refer to FIG. 12), place E is a place in which the Vs potential region 81, which is an intermediate potential region, and the second high concentration region 62 of the high voltage junction terminal region (HVJT) oppose each other. Therefore, place E is the place where the distance at which the Vs potential region 81, which is an intermediate potential region, and the high voltage junction terminal region (HVJT) oppose each other is smallest (hereafter referred to as the opposing place E).

As this kind of high voltage integrated circuit, a more detailed description of a high voltage integrated circuit chip is given in JP-A-2001-210972 to International Publication 2012-176347.

A circuit for protecting a high voltage integrated circuit that drives a power transistor with a half-bridge configuration is shown in JP-A-2001-210972. The circuit being a circuit that allows for an excessive negative swing at an output node (point), a high voltage integrated circuit chip having a resistor that limits current during a negative voltage spike between the substrate and the ground is disclosed.

Also, a device such that the effect of reverse bias is reduced by a diode being inserted between the drain electrode of a switching element belonging to a level shifter and the gate electrode of a MOS transistor belonging to an amplifier (C-MOS circuit) is disclosed as a high voltage integrated circuit device in JP-A-2001-25235.

Also, as another high voltage integrated circuit device, it is disclosed in JP-A-2008-301160 that the drain of a switching element belonging to a level shifter, a level shift resistor, and a current limiting resistor are connected in series, and a portion between the level shift resistor and current limiting resistor is adopted as an output portion of a level-up circuit.

Also, the following device is disclosed as another high voltage integrated circuit device in JP-A-2010-263116. A high breakdown voltage diode (D3) is provided between a common ground node (COM) and a virtual ground node (Vs) inside a high voltage integrated circuit (HVIC) by utilizing a common substrate region. It is disclosed that, by so doing, a drop in high potential side power supply voltage due to negative voltage undershoot occurring in the high potential side reference potential (virtual ground Vs) is reliably suppressed in a power device drive circuit.

Also, a description is given of a power device drive circuit as another high voltage integrated circuit device in International Publication 2012-176347. In this power device drive circuit, the contact of a high voltage junction terminal region portion in a place physically near a high potential side reference potential (virtual ground Vs) is reduced, or the length of a voltage resistant region is increased, and a double RESURF structure is partially added. It is disclosed that, by so doing, there is a reduction in the amount of carriers implanted into the high potential side reference potential (virtual ground Vs) in accompaniment to a drop in the high potential side power supply voltage caused by negative voltage undershoot.

SUMMARY OF THE INVENTION

The description of the connection shown in FIG. 7 is of a case wherein the Vss voltage is in the region of 1,200V, and the H-VDD voltage is a potential in the region of 15V higher than Vs.

When the upper arm IGBT 115 is carrying out an on-state operation and the lower arm IGBT 114 is carrying out an off-state operation, current flows from the upper arm IGBT 115 to the L load 118. When the upper arm IGBT 115 switches from this state to an off-state operation, the L load 118 attempts to maintain the current, and current flows from the GND via the lower arm FWD 116. Therefore, the potential of the Vs terminal becomes lower than the GND potential, reaching in the region of, for example, −30V. When the potential of the Vs terminal is in the region of −30V, the potential of the H-VDD terminal is in the region of −15V (=−30V+15V).

The structure of the high voltage integrated circuit device shown in FIG. 11 is such that the p-type substrate 1 and p-type common potential region 61 are of the GND potential. A description will be given of a case wherein the potential of the Vs terminal drops until the n-type well region 3 and n$^-$-type well region 4 are both lower than the GND potential.

The parasitic diode 45 formed of the p-type substrate 1 and n-type well region 3 and the parasitic diode 46 formed of the p-type common potential region 61 and n$^-$-type well region 4 are forward biased, and a large current flows. The current flows via a capacitor between the gate and emitter of the IGBT 115. As there is no resistance component limiting the current in this current path, the current becomes an extremely large pulse current. Due to this pulse current, the HVIC 111 may be destroyed, or malfunction may occur.

Also, FIGS. 11 and 12 are such that when a negative voltage surge is applied to the Vs pad (terminal) or H-VDD pad (terminal), holes are implanted from the p-type common potential region 61 into the n$^-$-type well region 4 (as the substrate resistivity is high and the anode resistance is high, the parasitic diode 45 is minimal as an implantation path). In particular, the resistance of the n$^-$-type well region 4 (the cathode resistance of the parasitic diode 46) between the Vs potential region 81 and p-type common potential region 61 is small compared with other places in the opposing place E, where the distance at which the high voltage junction terminal region (HVJT) opposes the Vs potential region 81, which is an intermediate potential region, is small. Therefore, the amount of holes implanted from the p-type common potential region 61 into the n⁻-type well region 4 is greater than in other places. The holes entering the n⁻-type well region 4 pass below the second high concentration region 62, which is an n-type contact region, and flow into the p-type offset region 31 and p-type drain region 36, which are the negative potential Vs potential region. The holes flowing into the p-type offset region 31 are extracted from the p-type contact region 38 into the Vs terminal.

However, one portion of the holes also infiltrates a portion below the n-type source region 37, forming the gate current of a parasitic npn transistor configured of the n-type source region 37, p-type offset region 31, and n-type well region 3, and it may happen that the logic portion of the high side circuit is caused to malfunction by the parasitic npn transistor being turned on.

Furthermore, it may happen that the holes that also infiltrate a portion below the n-type source region 37 cause a parasitic thyristor configured of the n-type source region 37, p-type offset region 31, n-type well region 3, and p-type substrate 1 to be turned on (latch-up), thereby causing destruction of the high side circuit. Also, when one portion of the holes flows through the n-type well region 3 into the p-type drain region 34, it may happen in this case too that the logic portion of the high side circuit is caused to malfunction.

Also, the technology described in JP-A-2001-210972 is such that a resistor that limits current is connected between the GND (ground) terminal and the substrate, but there is no description relating to connections in places other than this. As the resistor is formed of a polysilicon layer, there is concern that thermal dissolution of the polysilicon layer due to overcurrent will lead to destruction when a large pulse current (several amps to several tens of amps) of negative voltage transiently flows through a parasitic diode between the Vs terminal and GND terminal.

Also, the technology described in JP-A-2001-25235 is such that there is no description relating to resistance or a layout method that limits the current of a body diode or parasitic diode when a diode is connected in order to reduce the effect of reverse bias, and the H-VDD has negative potential due to the L load.

Also, the technology described in JP-A-2008-301160 is such that it is described that a current limiting resistor is connected in a path between the high potential side (H-VDD) and low potential side (ground) of a level shifter circuit Vs reference low voltage power supply. It is described that, by so doing, it is possible to prevent a body diode or parasitic diode itself of an n-channel MOSFET from being destroyed by overcurrent, and to prevent places in the level shifter circuit in which current capacity is small from being destroyed by overcurrent. However, there is no description of preventing parasitic malfunction (incorrect inversion) of the Vs reference high side circuit.

Also, the technology described in JP-A-2010-263116 is such that it is described that a high breakdown voltage diode (D3) is provided between a Vs terminal and the substrate of a high voltage control circuit (HVIC), which is of the GND potential, but there is no description of a diode being provided between a VB terminal, which is a bootstrap power supply node, and the substrate of the high voltage control circuit (HVIC), which is of the GND potential.

Also, the technology described in International Publication 2012-176347 is such that the contact of a high voltage junction terminal region portion in a place physically near a Vs potential region of a high side circuit portion is reduced. Alternatively, the length of a voltage resistant region is increased, and a double RESURF structure is partially added. There is a description of a layout method whereby, by doing as heretofore described, there is a reduction in the amount of carriers implanted into the Vs potential region in accompaniment to a drop in the high potential side power supply voltage caused by negative voltage undershoot. However, although it is possible to suppress high side circuit malfunction and destruction for a certain negative voltage surge period, a large amount of carriers are also implanted into the Vs potential region when the negative voltage value is high or when the negative voltage pulse period is long, because of which it is no longer possible to prevent high side circuit malfunction and destruction. Therefore, the advantages are limited.

In order to resolve the heretofore described problems, an object of the invention is to provide a high voltage integrated circuit device such that it is possible to suppress the amount of holes implanted due to a negative voltage surge, thus preventing high side circuit malfunction and destruction.

In order to resolve the heretofore described problems, thus achieving the object of the invention, a high voltage integrated circuit device according to the invention is a high voltage semiconductor integrated circuit device that drives a high potential side power transistor of two power transistors connected in series, the high voltage integrated circuit device being configured to include a second conductivity type high potential region formed in a surface layer or on the surface of a first conductivity type semiconductor layer, a second conductivity type voltage resistant region, formed in a surface layer or on the surface of the semiconductor layer, in contact with and enclosing the high potential region and of an impurity concentration lower than that of the high potential region, a first conductivity type common potential region in contact with and enclosing the voltage resistant region in a surface layer or on the surface of the semiconductor layer, a first conductivity type intermediate potential region formed inside the high potential region, a second conductivity type first high concentration region formed in a surface layer of the high potential region, a first conductivity type second high concentration region formed in a surface layer of a common potential region, a first pickup electrode in contact with the first high concentration region, and a second pickup electrode in contact with the second high concentration region, wherein the intermediate potential region is a region that configures a circuit region formed inside the high potential region and to which is applied an intermediate potential between the high potential side potential of a high voltage power supply that is the main circuit power supply of the two power transistors connected in series and the common potential that is the low potential side potential of the high voltage power supply, the high potential region is a region to which the high potential side potential of a low voltage power supply is applied with the intermediate potential as a reference, and a high voltage junction terminal region is a region formed of the voltage resistant region, the common potential region, the first high concentration region, and the second high concentration region, the high voltage integrated circuit device further including a first conductivity type aperture portion that reach the first conductivity type semiconductor layer from the surface of the high potential region, encloses the circuit region, and has a gap portion, wherein the first high concentration region is disposed in the voltage resistant region or high potential region between the common potential region in the place in which the gap portion is positioned and the circuit region.

Effects

The invention is such that a p⁻-type aperture portion enclosing the Vs potential inside a high side drive circuit, and an H-VDD terminal pickup electrode in a place in which the p⁻-type aperture portion is not disposed, are provided. Therefore, when the potential of a Vs terminal drops in a negative direction, and an n-type well region of the high side drive circuit and a high voltage junction terminal region connected to the potential of the H-VDD terminal transiently drops below a GND potential, it is possible to cause the current implantation (hole carrier implantation) of a parasitic diode configured with a p-type region that is a common potential region of the high voltage junction terminal region as an anode layer, and an n⁻-type well region that is a voltage resistant region of the high voltage junction terminal region as a cathode layer, to flow into the pickup electrode portion.

Therefore, it is possible to suppress the implantation of a transiently flowing excessive hole current into the high side logic (Vs potential) region.

As a result of this, it is possible to prevent false signal transmission of high side logic caused by a negative voltage surge, without increasing the chip area. Also, by pads and a capacitance element being disposed between the pickup electrode and Vs potential region, it is possible to maintain distance from the anode layer to the Vs potential region using a configuration with high layout efficiency, and thus possible to dramatically suppress the amount of hole carriers implanted into the Vs potential region.

According to the invention, it is possible, by providing a p⁻-type aperture portion having a gap portion, to provide a semiconductor device such that it is possible to suppress the amount of holes implanted due to a negative surge, thus preventing high side circuit malfunction and destruction.

BRIEF DESCRIPTION OF THE DRAWINGS

FIGS. 2A and 2B are main portion sectional views of FIG. 1, wherein FIG. 2A is a main portion sectional view cut along an A-A' line of FIG. 1, and FIG. 2B is a main portion sectional view cut along a B-B' line of FIG. 1;

FIGS. 6A and 6B are main portion plan views of a high voltage integrated circuit device of a fifth embodiment according to the invention, wherein FIG. 6A is a view when one portion of a first high concentration region is protruding (400a), and FIG. 6B is a view when one portion of the first high concentration region is protruding, and an aperture portion is also protruding in that place (400b);

FIGS. 14A and 14B are main portion sectional views of FIG. 13, wherein FIG. 14A is a main portion sectional view cut along a C-C' line of FIG. 13, while FIG. 14B is a main portion sectional view cut along a D-D' line of FIG. 13;

FIGS. 15A and 15B are main portion sectional views of FIG. 13, wherein FIG. 15A is a main portion sectional view cut along the C-C' line of FIG. 13, while FIG. 15B is a main portion sectional view cut along the D-D' line of FIG. 13;

FIGS. 16A and 16B are main portion sectional views of FIG. 13, wherein FIG. 16A is a main portion sectional view cut along the C-C' line of FIG. 13, while FIG. 16B is a main portion sectional view cut along the D-D' line of FIG. 13; and FIG. 17, being a main portion sectional view of FIG. 13, is a main portion sectional view cut along the C-C' line of FIG. 13.

DETAILED DESCRIPTION OF THE INVENTION

The invention will be described using the following embodiments. In the specification and attached drawings, a layer or region being prefixed by n or p means that electrons or holes respectively are majority carriers. Also, + or − attached to n or p indicates a higher impurity concentration or lower impurity concentration respectively than in a layer or region to which + or − is not attached. The same reference signs are attached to sites the same as sites of an existing structure.

Embodiment 1

Figure 1:
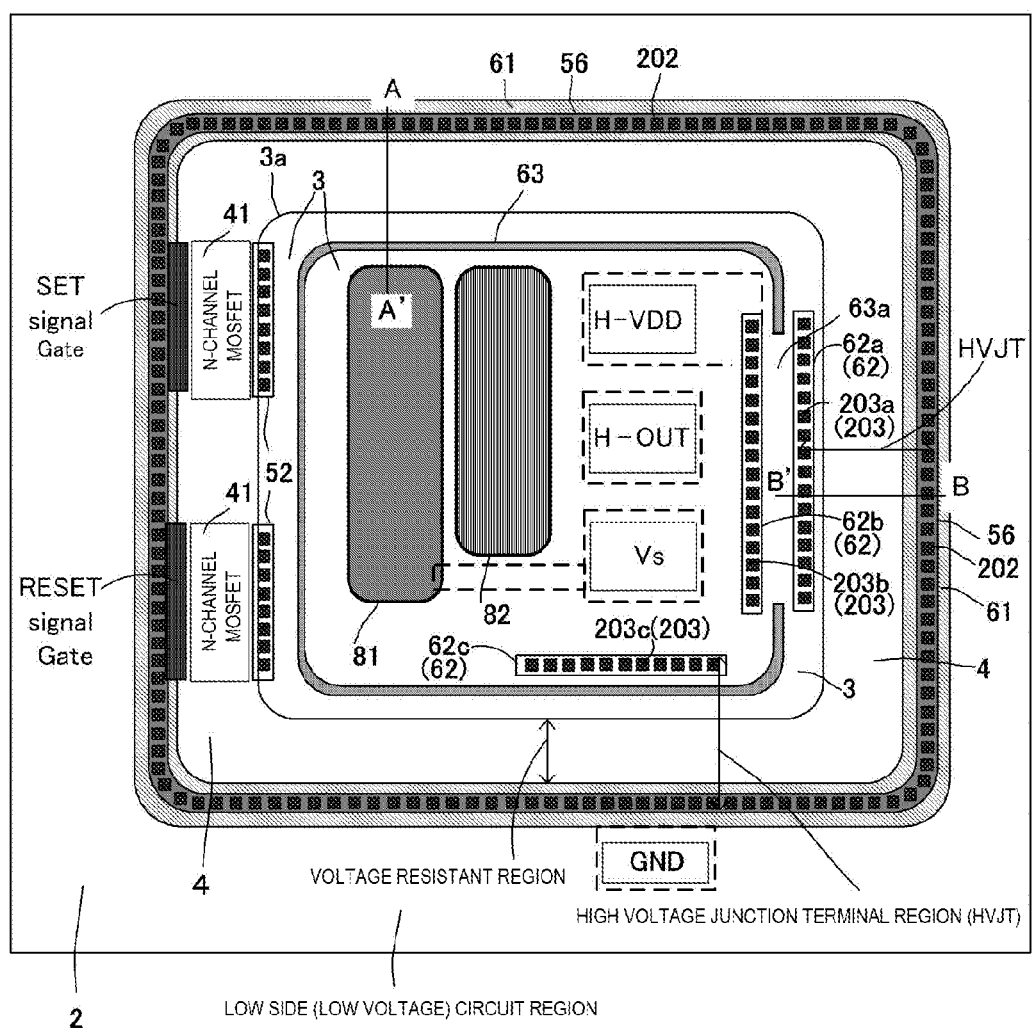
FIG. 1 is a main portion plan view of a high voltage integrated circuit device of a first embodiment according to the invention.

FIGS. 1 and 2A and 2B are configuration diagrams of a high voltage integrated circuit device 100 of a first embodiment according to the invention, FIG. 1 being a main portion plan view and FIGS. 2A and 2B being main portion sectional views of FIG. 1, wherein FIG. 2A is a main portion sectional view cut along an A-A' line of FIG. 1, and FIG. 2B is a main portion sectional view cut along a B-B' line of FIG. 1.

The high voltage integrated circuit device 100 includes an n-type well region 3, which is a high potential region formed in a surface layer of a p-type substrate 1 (semiconductor layer), and an n⁻-type well region 4, which is a voltage-resistant region of an impurity concentration lower than that of the n-type well region 3, in contact with the n-type well region 3 in the surface layer of the p-type substrate 1 and formed around the outer periphery of the n-type well region 3.

Also, the high voltage integrated circuit device 100 includes a p-type common potential region 61, in contact with the n⁻-type well region 4 in the surface layer of the p-type substrate 1 and formed around the outer periphery of the n⁻-type well region 4, to which a common potential (for example, ground potential) is applied, and an n-type well region 2, which is a low potential region in contact with the p-type common potential region 61.

The impurity concentration of the p-type substrate 1 is preferably $2.0 \times 10^{13}/cm^3$ to $1.0 \times 10^{15}/cm^3$, while the impurity concentration of the p-type common potential region 61 is preferably within a range of $2.0 \times 10^{15}/cm^3$ to $5.0 \times 10^{18}/cm^3$.

Figure 7:
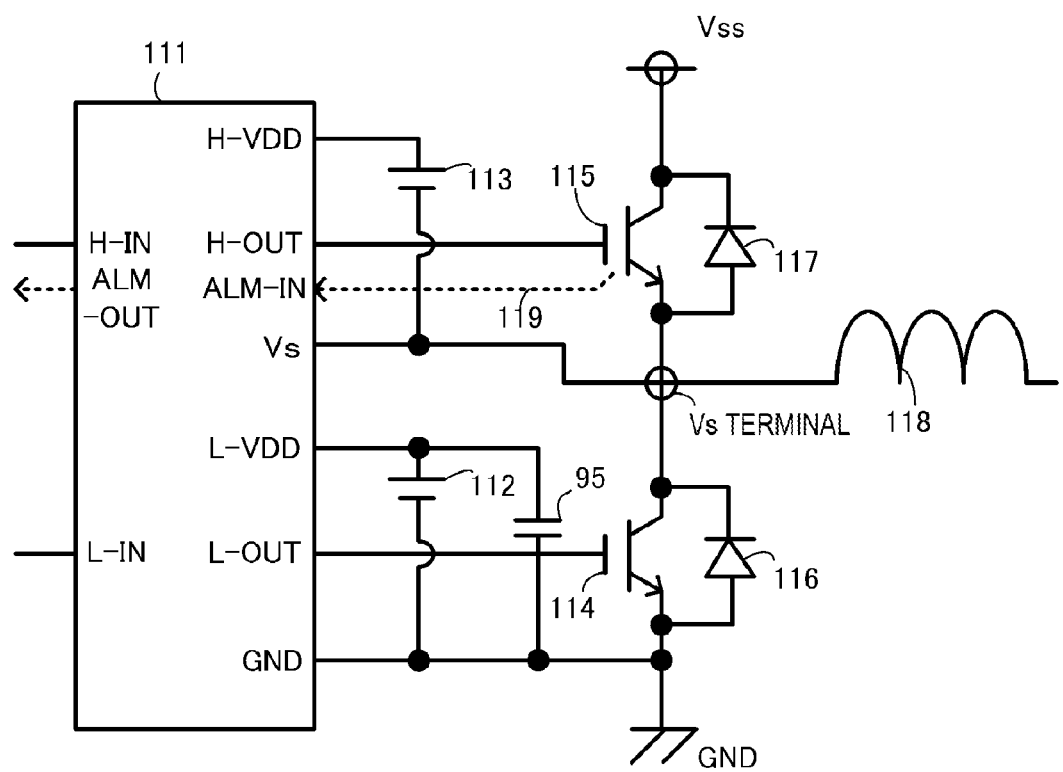
FIG. 7 is an illustration showing an example of the connection of a switching power device of a power conversion device, such as an inverter, and an existing HVIC that drives the switching power device.
Figure 8:
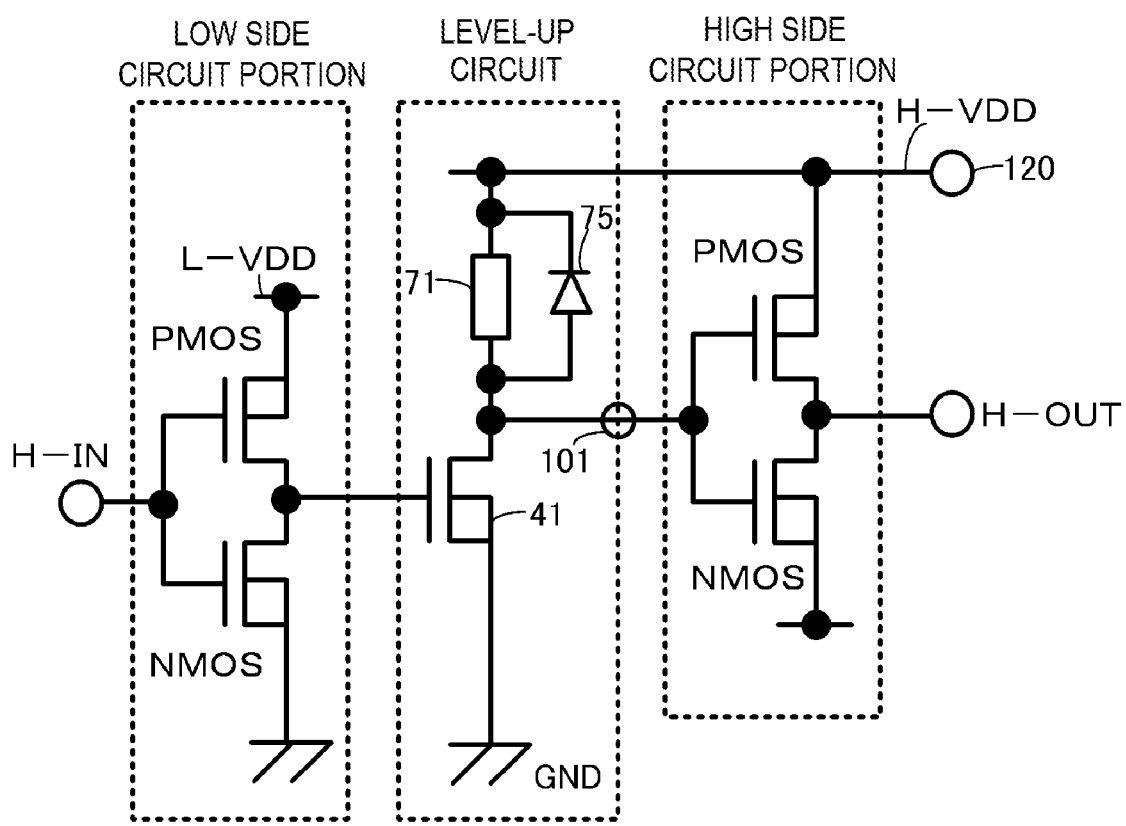
FIG. 8 is a circuit diagram showing level shifter circuits inside the HVIC shown in FIG. 7 and circuits peripheral to the level shifter circuits, and is a circuit diagram including a level-up circuit.
Figure 9:
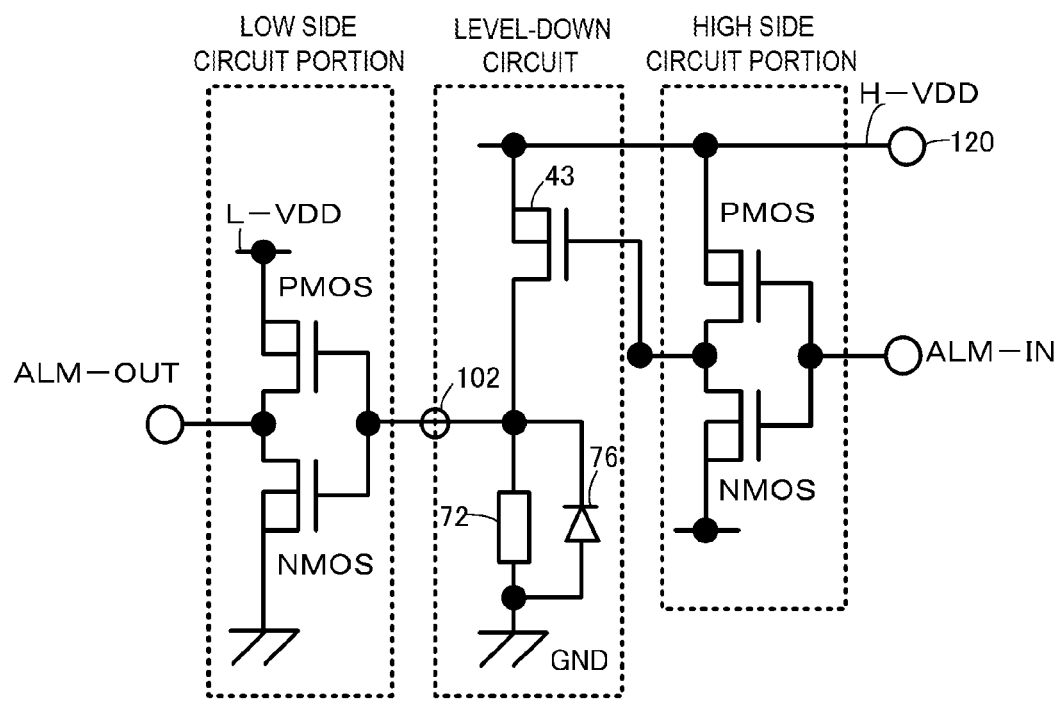
FIG. 9 is a circuit diagram showing level shifter circuits inside the HVIC shown in FIG. 7 and circuits peripheral to the level shifter circuits, and is a circuit diagram including a level-down circuit.
Figure 10A:
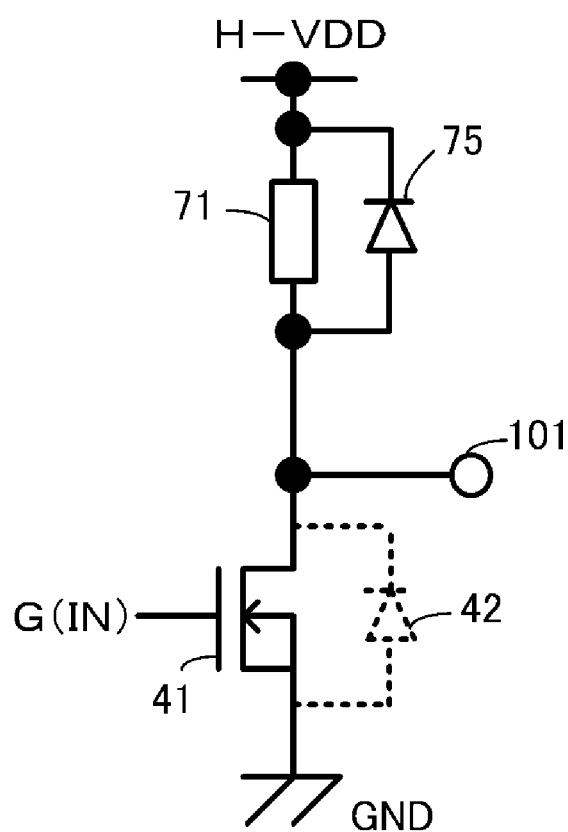
FIGS. 10A and 10B are detailed diagrams of the level shifter circuit of the existing HVIC.
Figure 10B:
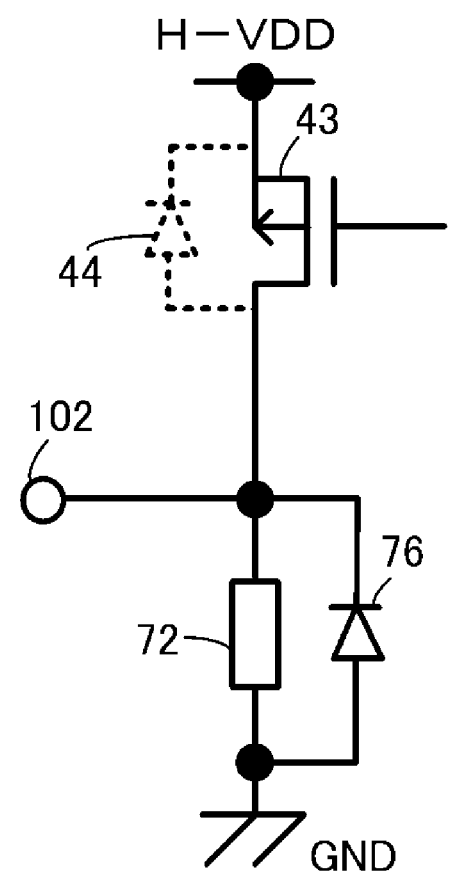
Figure 11:
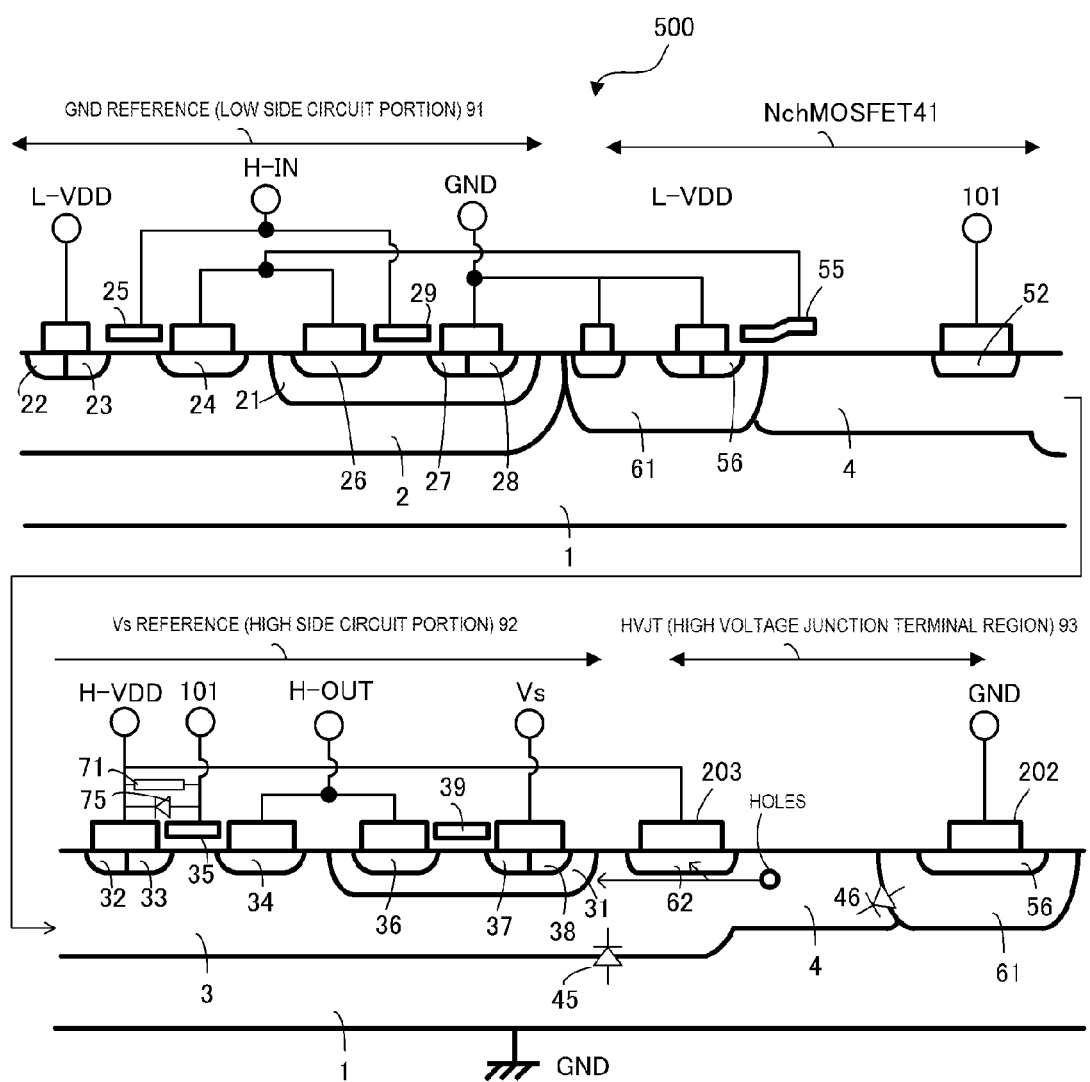
FIG. 11 is sectional views showing logic portions of a high side circuit and low side circuit of an existing self-isolation type of high voltage integrated circuit device, and main portions of a level-up circuit portion and high voltage junction terminal region (HVJT)
Figure 12:
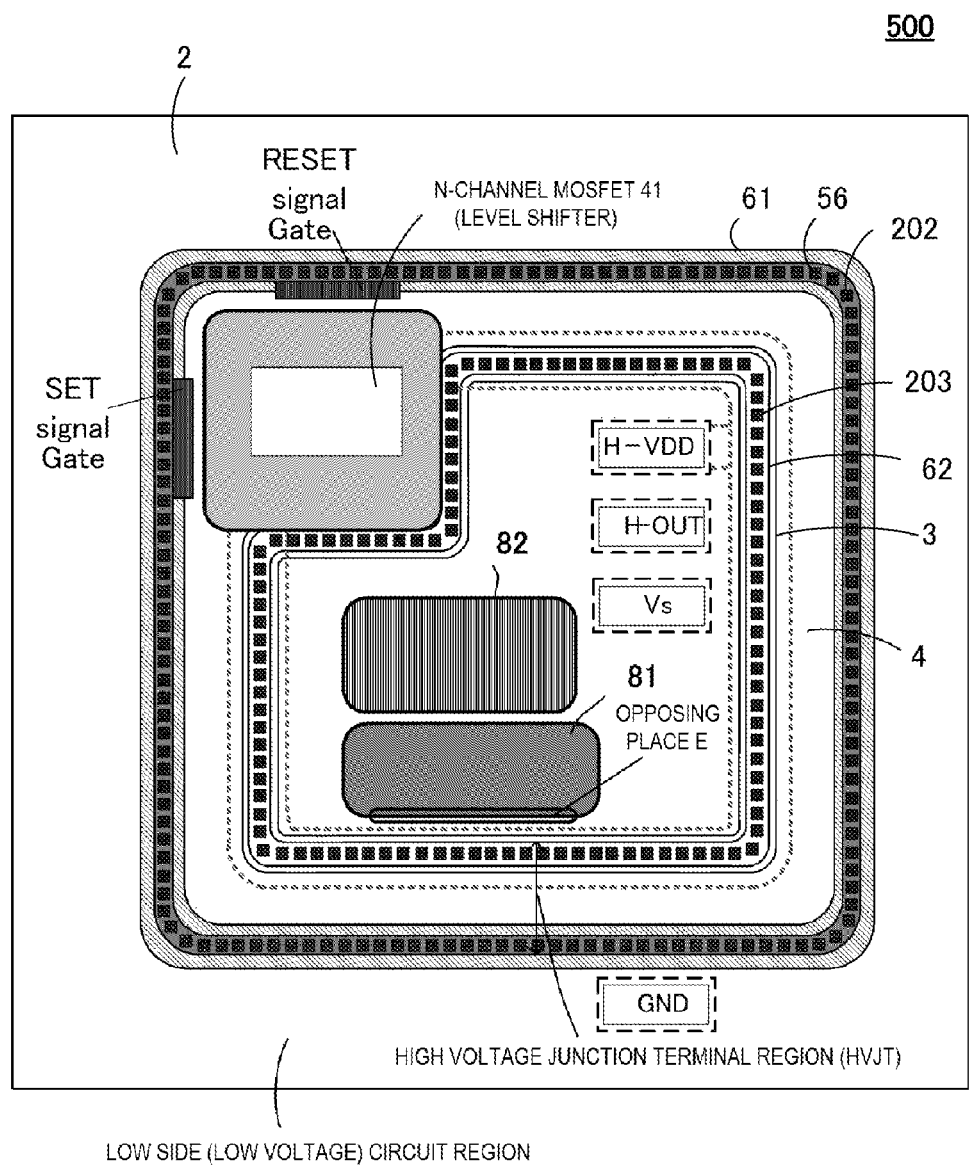
FIG. 12 is a deployment diagram showing main portions of the high side circuit, level shifter, and the like, of FIG. 11.

The high voltage integrated circuit device 100 is a device corresponding to the HVIC 111 shown in FIG. 7. Therefore, the circuits shown in FIGS. 8 and 9 can be included. Also, the C-MOS of the low side circuit shown in FIG. 11 can be formed in the n-type well region 2, and the C-MOS of the high side circuit shown in FIG. 11 can be formed in the n-type well region 3.

A Vs potential region 81, which is an intermediate potential region, is formed inside the n-type well region 3, which is a high potential region. The Vs potential region 81 is the p-type offset region 31 and p-type drain region 34 of FIG. 11.

Also, the high voltage integrated circuit device 100 includes a second high concentration region 62, which is an n-type contact region formed in a surface layer of the n-type well region 3, and a first high concentration region 56, which is a p-type contact region formed in a surface layer of the p-type common potential region 61.

Also, as shown in FIGS. 2A and 2B, the high voltage integrated circuit device 100 includes a first pickup electrode 202 in contact with the first high concentration region 56, and a second pickup electrode 203 in contact with the second high concentration region 62. The first and second pickup electrodes 202 and 203 are configured of band-like metal films 202a and 203d, and metals 202b and 203e that fill contact holes. In FIG. 1, to avoid the diagram becoming confusing, the band-like metal films 202a and 203d are omitted, and the metals 202b and 203e filling a large number of contact holes are shown as the pickup electrodes 202 and 203. Of course, a band-like contact hole may be adopted instead of multipoint contact holes.

The Vs potential region 81, which is an intermediate potential region formed inside the n-type well region 3, which is a high potential region, is a region to which is applied an intermediate potential between the high potential side potential Vss of a high voltage power supply, which is the main circuit power supply of the two power transistors connected in series shown in FIG. 7, and the ground potential GND.

Also, an H-VDD potential region 82 to which, with the intermediate potential Vs shown in FIG. 7 as a reference, a potential (V-HDD) higher than the intermediate potential Vs is applied by the previously described second low voltage power supply 113, is included in the n-type well region 3.

Also, the Vs potential region 81, the H-VDD potential region 82, an H-VDD pad, an H-OUT pad, a Vs pad, the second high concentration region 62, the second pickup electrode 203, and a p⁻-type aperture portion 63 having a gap portion 63a, are formed in the n-type well region 3.

Also, a high voltage junction terminal region (HVJT) 193 is a region formed of the voltage-resistant region that is the n⁻-type well region 4, the p-type common potential region 61, the first high concentration region 56, and the second high concentration region 62.

Also, the high voltage integrated circuit device 100 includes the p⁻-type aperture portion 63, formed to reach the p-type substrate 1 from the surface of the n-type well region 3 and having the gap portion 63a. Also, it is desirable with regard to preventing an implantation of carriers that the p⁻-type aperture portion 63 is disposed along an end portion of the n-type well region 3 on the inner side of the n-type well region 3. The high voltage integrated circuit device 100 includes one second high concentration region 62a (62) disposed along an end portion of the n-type well region 3 in the vicinity of the gap portion 63a. Also, the high voltage integrated circuit device 100 includes one more second high concentration region 62b (62) disposed opposing the one second high concentration region 62a (62) inside the n-type well region 3.

The high voltage integrated circuit device 100 includes second pickup electrodes 203a and 203b (203) in contact with the two second high concentration regions 62a and 62b (62) respectively.

Also, a second high concentration region 62c (62) separate from the second high concentration regions previously described is provided in the n-type well region 3 on the inner side of the p⁻-type aperture portion 63 in a place in which there is no gap portion 63a, and voltage is fed to the H-VDD pad from a second pickup electrode 203c (203) connected to the second high concentration region 62c (62) and the second pickup electrode 203b (203) connected to the second high concentration region 62b (62). The voltage of the V-HDD pad forms the power supply of a circuit formed in the n-type well region 3, which is a high potential region. The reference signs 62 and 203 are reference signs attached as collective terms for the reference signs 62a, 62b, 62c, 203a, 203b, and 203c.

In the high voltage integrated circuit device 100 shown in FIGS. 1 and 2A and 2B, the n-type well region 3, which is a high side floating potential region formed on the p-type substrate 1, and the n⁻-type well region 4, which is a voltage-resistant region, are each such that, for example, phosphorus is ion implanted, and subsequently diffused to a predetermined diffusion depth by a high temperature (in the region of 1,100 to 1,200° C.) diffusion process.

Also, in the same way, the p-type common potential region 61 is such that a boron impurity is ion implanted, and subsequently diffused to a predetermined diffusion depth by a high temperature (in the region of 1,100 to 1,200° C.) diffusion process.

The p⁻-type aperture portion 63 is formed in one portion of the formation region of the n-type well region 3 using, for example, the same diffusion layer as the p-type common potential region 61. The width of the p⁻-type aperture portion 63 is such that breakdown voltage characteristics are not lost even when the H-VDD terminal (pad) leaps to a high potential of in the region of 1,200V. This is achieved by the width of the p⁻-type aperture portion 63 being set to the width for which depletion layers extending from the n-type well region 3 are in contact, so that the p⁻-type aperture portion 63 is depleted. Herein, the width of the p⁻-type aperture portion 63 is a width in the region of 15 to 30 μm.

Subsequently, the second high concentration region 62 (an n-type contact region which is an n⁺-type region) for creating an Ohmic contact with the second pickup electrode 203 to be connected to the H-VDD terminal is formed to a predetermined depth by, for example, arsenic being ion implanted so as to reach a surface concentration of in the region of $1\times10^{20}/cm^3$, and a subsequent annealing process being performed at in the region of 750 to 900° C.

Also, the first high concentration region 56 (a p-type contact region which is a $p^+$-type region) for creating an Ohmic contact with the first pickup electrode 202 to be connected to the GND terminal is formed to a predetermined depth by, for example, $BF_2$ being ion implanted so as to reach a surface concentration of in the region of $1\times10^{20}/cm^3$, and a subsequent annealing process being performed at in the region of 750 to 900° C.

Subsequently, the first pickup electrode 202 and second pickup electrode 203, configured of the metals 202b and 203e that fill the contact holes and the band-like metal films 202a and 203d connected to the metals 202b and 203e, are formed by a contact hole formation process, a metal sputtering process, and a protective film formation process. In the gap portion 63a, the HVJT 193 is configured of the first high concentration region 56, the p-type common potential region 61, the $n^-$-type well region 4, which is a voltage-resistant region, the n-type well region 3, which is a high potential region, and the second high concentration region 62a (62). Also, in places other than the gap portion 63a, the HVJT 193 in a place in which the second high concentration region 62c exists is configured of the first high concentration region 56, the p-type common potential region 61, the $n^-$-type well region 4, which is a voltage-resistant region, the n-type well region 3, which is a high potential region, the $p^-$-type aperture portion 63, and the second high concentration region 62c. Also, in places other than the gap portion 63a, the HVJT 193 in a place in which the second high concentration region 62c does not exist is configured of the first high concentration region 56, the p-type common potential region 61, the $n^-$-type well region 4, which is a voltage-resistant region, and an end portion of the n-type well region 3, which is a high potential region.

As shown in FIGS. 1 and 2A and 2B, the Vs potential region 81, the H-VDD potential region 82, and the like, are disposed inside the $p^-$-type aperture portion 63 in the n-type well region 3, which is a high side floating potential region (high potential region). The Vs potential region 81 is a region in which a high side logic portion is formed. The Vs potential region 81 is a region in which are formed the source, base, and drain regions of the NMOSFET formed in the p-type offset region 31, the p-type drain region 34, and the like, shown in FIG. 11. Also, the H-VDD potential region 82 is a region in which are formed the source and base regions (the n-type contact region 32 and p-type source region 33 shown in FIG. 11) of the PMOSFET formed in the n-type well region 3 in the high side logic portion, and the like. In the drawings, the Vs potential region 81 and H-VDD potential region 82 are shown separated for the sake of convenience, but in actuality, the regions thereof are disposed mixed together inside the n-type well region 3.

Herein, as shown in FIG. 1, the $p^-$-type aperture portion 63 is disposed so as to enclose the Vs potential region 81, the H-VDD potential region 82, each pad, and the second high concentration region 62c. The region enclosed by the $p^-$-type aperture portion 63, except for the region in which the gap portion 63a exists, is junction-isolated by the $p^-$-type aperture portion 63 from the region on the outer side of the $p^-$-type aperture portion 63.

In FIG. 1, the gap portion 63a in which the $p^-$-type aperture portion 63 is not formed is provided in one side (the side on the right side of the drawing) of the four-sided high voltage junction terminal region (HVJT). The first second high concentration region 62a (62) is disposed in an end portion of the n-type well region 3 in the place in which the gap portion 63a exists, and the second second high concentration region 62b (62) is disposed so as to oppose the first second high concentration region 62a (62). Furthermore, the third second high concentration region 62c (62) is disposed on the inner side of the $p^-$-type aperture portion 63. The second pickup electrodes 203 (203a, 203b, and 203c) to be connected to the second high concentration regions 62 are formed. The second pickup electrodes 203 are shown in the diagram as a large number of black squares, as previously described, and are connected to an H-VDD terminal.

In FIGS. 2A and 2B, the parasitic diode 46 is formed with the second high concentration region 62 as a cathode, the first high concentration region 56 (p-type common potential region 61) as an anode, and the $n^-$-type well region 4 sandwiched between the cathode and anode as a drift layer. The cathode of the diode 46 connects via the gap portion 63a with the n-type well region 3 enclosed by the $p^-$-type aperture portion 63. Of the current flowing through the diode 46, the holes are implanted from the diode 46 via the gap portion 63a into the n-type well region 3 enclosed by the $p^-$-type aperture portion 63. Meanwhile, the electrons, on the contrary, are implanted via the gap portion 63a from the second high concentration region 62 into the $n^-$-type well region 4. Therefore, this place will be called a diode current implantation region (the region shown by dotted lines in FIG. 3, to be described hereafter) in the following description.

By adopting the previously described configuration, the $p^-$-type aperture portion 63 forms a potential barrier when a negative voltage surge is input into the Vs terminal, because of which current flows dominantly in the diode current implantation region. Therefore, holes configuring the current almost completely cease to flow into the Vs potential region 81, and malfunction and destruction of the logic portion of the high side circuit can thus be prevented.

In FIGS. 1 and 2A and 2B, the H-VDD pad, OUT pad, and Vs pad are disposed in the high side drive circuit on the diode current implantation region side. By so doing, it is possible to maintain distance from the diode current implantation region to the Vs potential region 81 with high layout efficiency, and thus possible to reduce the amount of holes implanted into the Vs potential region 81. It is desirable that the distance from the gap portion 63a to the Vs potential region 81 is 100 µm or more.

Also, in this embodiment, the planar form of the end portion of the n-type well region 3 is quadrilateral. It is sufficient that the planar form of the end portion of the n-type well region 3 is a form configured of a plurality of sides, and corners having arc portions that connect the plurality of sides.

The $p^-$-type aperture portion 63 is formed continuously on a total of three sides of the four-sided HVJT 193, those being the side on which the n-channel MOSFET 41 is formed and the two sides adjacent thereto.

It is desirable that the $p^-$-type aperture portion 63 is disposed between the Vs potential region 81 and H-VDD potential region 82 and the HVJT 193 (end portion of the n-type well region 3) on at least these three sides. This means that it is desirable that the $p^-$-type aperture portion 63 is disposed between the Vs potential region 81 and H-VDD potential region 82 and the HVJT 193 on at least three sides, even when the HVJT 193 is formed of four sides or more.

Next, a more detailed description will be given of the flow of carriers (mainly holes) from the p-type common potential region 61 toward the n-type well region 3, which is a high side circuit region, when a negative voltage surge occurs.

Figure 3:
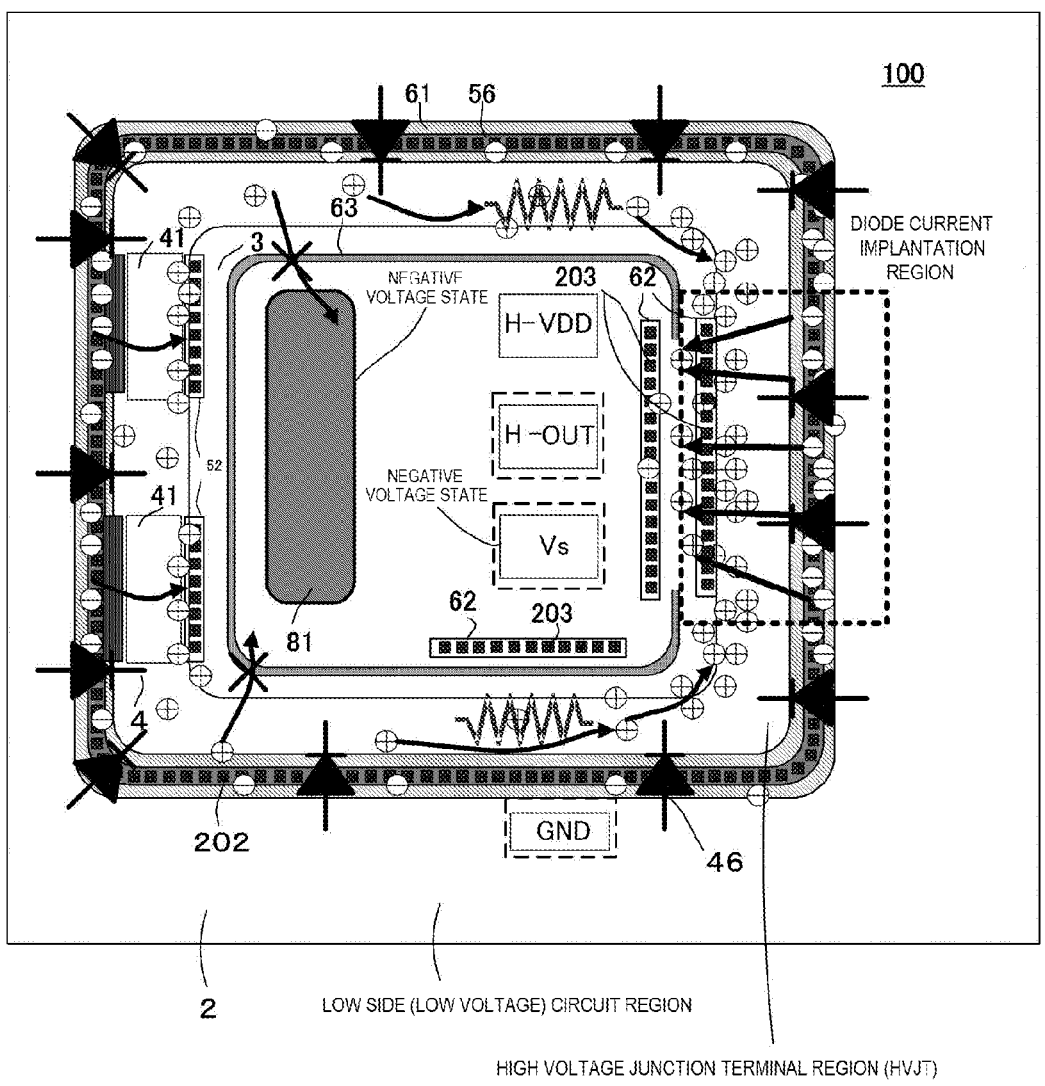
FIG. 3 is a diagram showing the flow of carriers when negative voltage surge occurs.

FIG. 3 is a diagram showing the flow of carriers when negative voltage surge occurs. In FIG. 3, when negative voltage is input into the first pickup electrode 202 and second pickup electrode 203 via the Vs terminal and H-VDD terminal respectively, the parasitic diode 46 shown in FIG. 2 is forward biased, holes flow to the n-type well region 3 side, which is a high side circuit region, and electrons flow to the p-type common potential region 61 (first high concentration region 56) side. At this time, holes flow readily into the diode current implantation region enclosed by dotted lines shown in FIG. 3, without flowing into the place junction-isolated by the p$^-$-type aperture portion 63, meaning that holes flow into the second pickup electrode 203 of the H-VDD terminal. Therefore, the flow of holes toward the Vs potential region 81 partitioned off by the p$^-$-type aperture portion 63 is suppressed. Also, when the high side circuit region is completely partitioned off by the p$^-$-type aperture portion 63 (when the p$^-$-type aperture portion 63 is disposed in a complete closed loop form), current flowing from the diode 46 concentrates in the n-type drain region 52 of the n-channel MOSFET 41, which is a level shifter device. Therefore, excessive current flows into the level-up circuit portion connected ahead of the n-type drain region 52. As a result of this, overcurrent destruction occurs in wiring connected to the level-up circuit portion, or malfunction occurs in the level-up circuit.

In order to avoid this, the invention is such that the gap portion 63a is provided in the p$^-$-type aperture portion 63, and the flow of holes to the second high concentration region 62 is concentrated to flow from this place. A region wherein the diode current can be caused to flow at low impedance is provided separately from the n-type drain region 52 of the n-channel MOSFET 41. That is, by the p$^-$-type aperture portion 63 being disposed, the diode current implantation region enclosed by the dotted lines is formed, because of which an advantage is also achieved in that the flow of current into the drain region of the n-channel MOSFET 41 configuring the level shifter circuit is reduced.

In this case, the p$^-$-type aperture portion 63 having the gap portion 63a is disposed on the inner side of the n-type well region 3 along the end portion of the n-type well region 3. Also, by two second high concentration regions 62 being disposed, it is possible to increase the advantage of reducing the amount of holes infiltrating the Vs potential region 81.

Also, although not shown in the drawing, the second high concentration region 62 may be disposed extended toward the n-channel MOSFET 41 in the n-type well region 3 on the outer side of the p$^-$-type aperture portion 63. However, it is necessary that the second high concentration region 62 is disposed maintaining a distance in the region of the width of the n$^-$-type well region 4, which is a voltage resistant region, from the n-channel MOSFET 41.

Also, it is sometimes the case that only one of the two mutually opposing second high concentration regions 62a and 62b is disposed. In this case, however, the hole extraction advantage is somewhat weakened.

Embodiment 2

Figure 4:
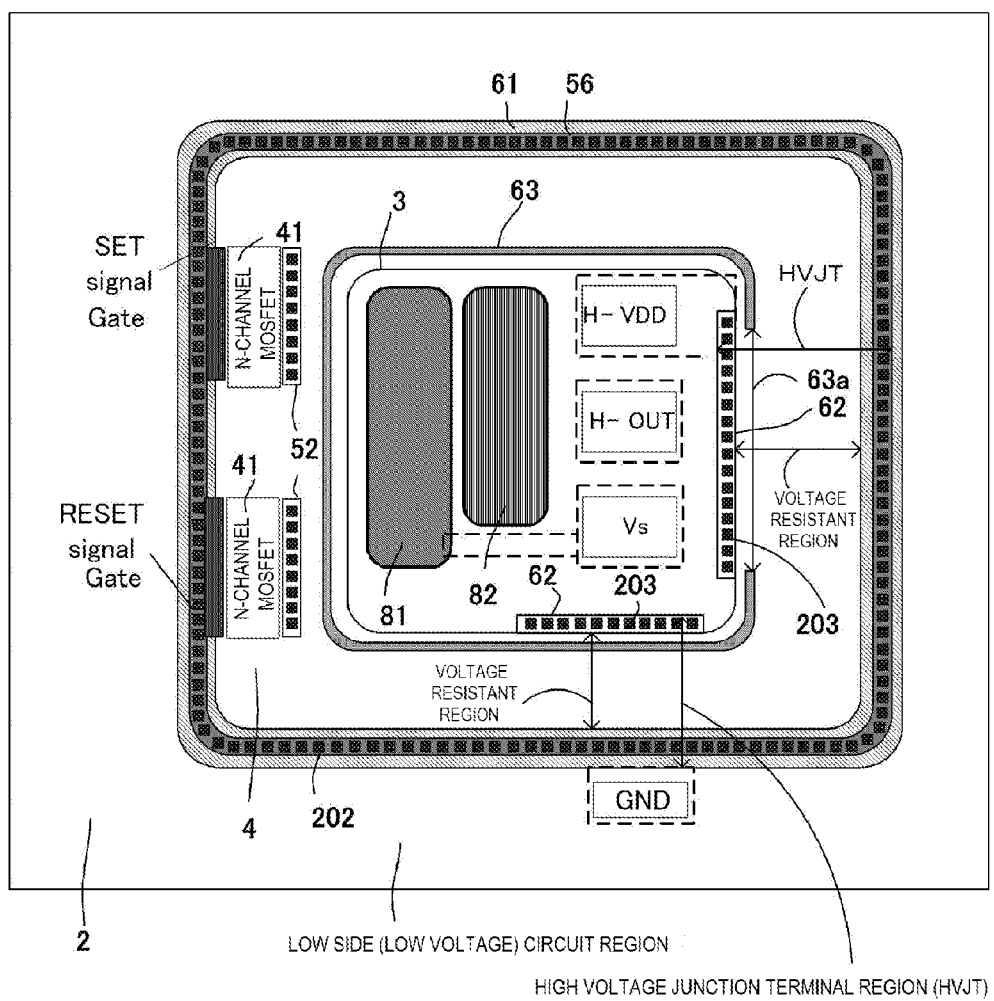
FIG. 4 is a main portion plan view of a high voltage integrated circuit device of a second embodiment of the invention.

FIG. 4 is a main portion plan view of a high voltage integrated circuit device 200 of a second embodiment of the invention. FIG. 4 differs from FIG. 1 in that the p$^-$-type aperture portion 63 having the gap portion 63a is disposed inside the n$^-$-type well region 4, which is a voltage resistant region, and one second high concentration region 62 is disposed in the end portion of the n-type well region 3, which is a high potential region.

The width of the p$^-$-type aperture portion 63 is such that breakdown voltage characteristics are not lost even when the H-VDD terminal (pad) leaps to a high potential of in the region of 600V. In order to achieve this, the width of the p$^-$-type aperture portion 63 is set to the width for which depletion layers extending from the n-type well region 3 to the p$^-$-type aperture portion 63 are in contact, so that the p$^-$-type aperture portion 63 is depleted. Herein, the width of the p$^-$-type aperture portion 63 is a width in the region of 10 to 20 μm. In this case too, advantages the same as in FIG. 1 are obtained.

In this embodiment too, the p$^-$-type aperture portion 63 is formed continuously on three sides of the HVJT 193. It is desirable that the p$^-$-type aperture portion 63 is provided between the Vs potential region 81 and H-VDD potential region 82 on these three sides.

Embodiment 3

Figure 13:
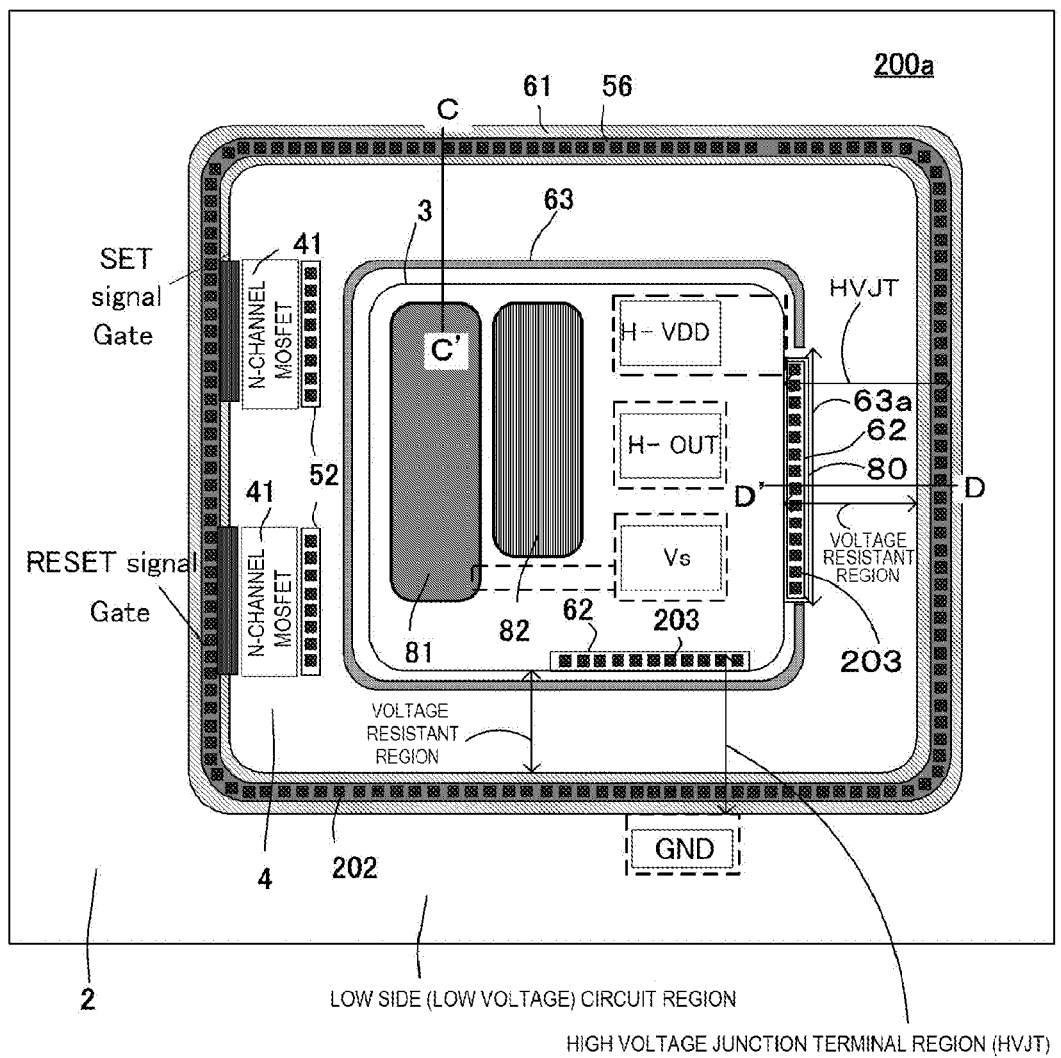
FIG. 13 is a main portion plan view of a high voltage integrated circuit device of a third embodiment of the invention.
Figure 14A:
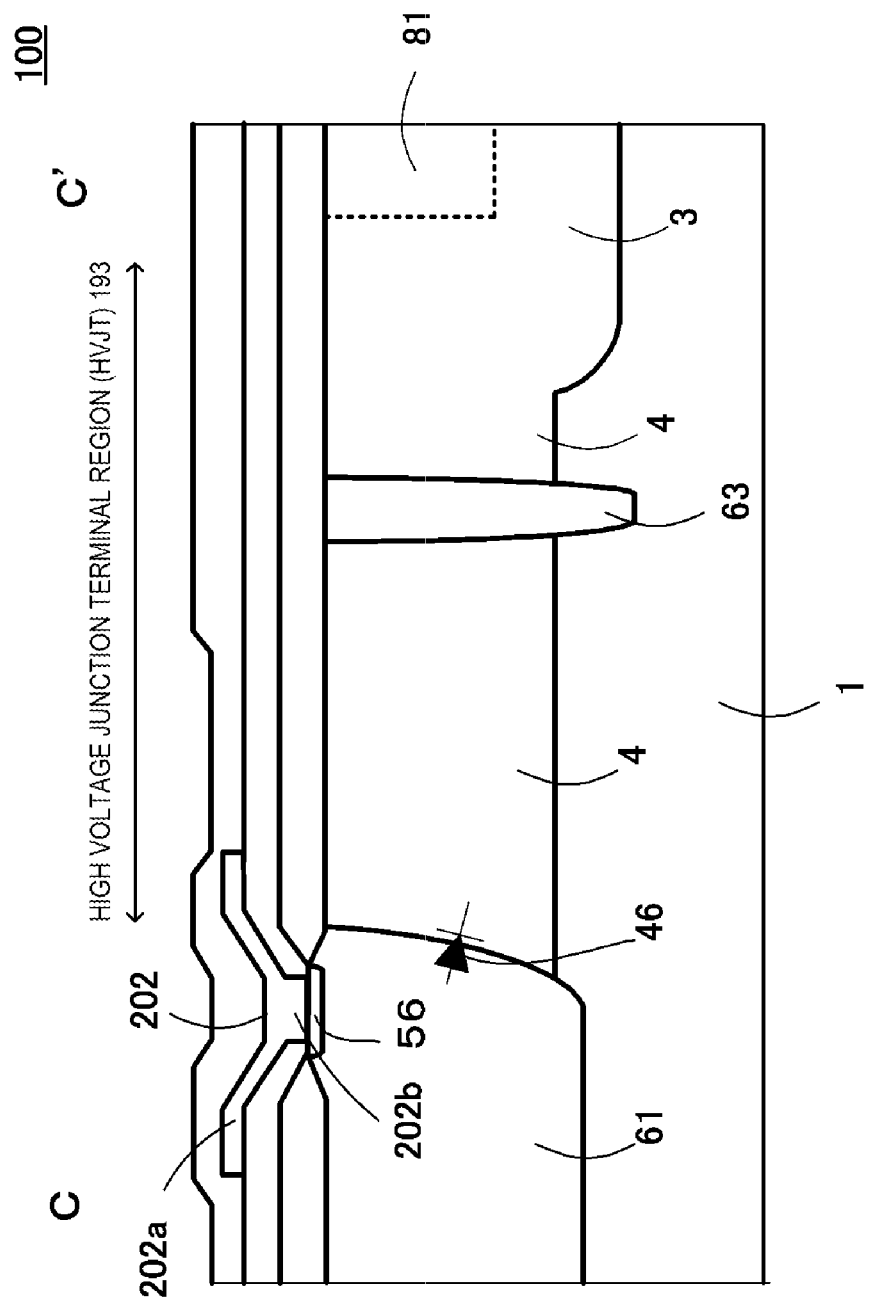
Figure 14B:
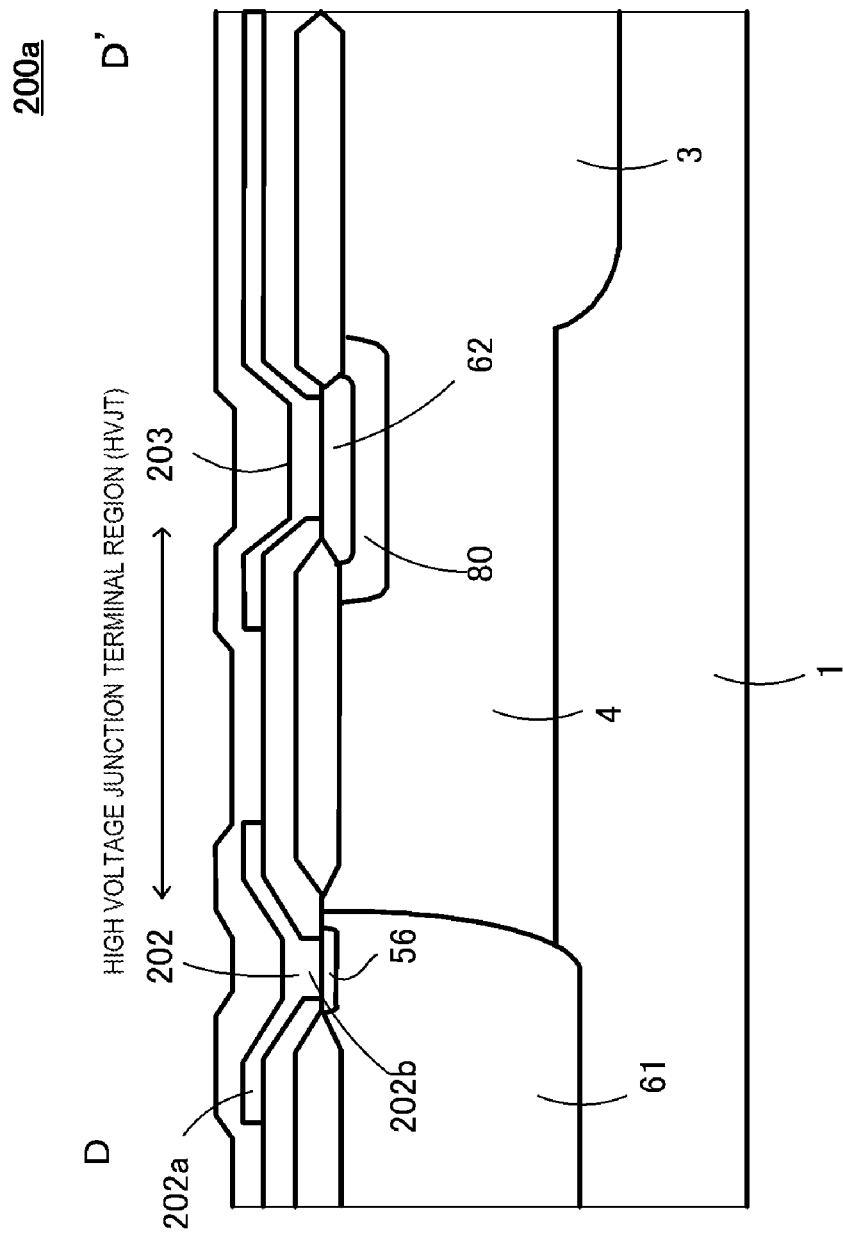

FIGS. 13 and 14A and 14B are configuration diagrams of a high voltage integrated circuit device 200a of a third embodiment according to the invention, wherein FIG. 13 is a main portion plan view and FIGS. 14A and 14B are main portion sectional views cut along a C-C' line and D-D' line of FIG. 13.

FIGS. 13 and 14A and 14B differ from FIG. 4 in that the second high concentration region 62 of the n$^-$-type well region 4, which is a voltage resistant region, is formed in the vicinity of the boundary with the n-type well region 3, which is a high potential region. The HVJT 193 in this place is a region formed of the second high concentration region 62, the n$^-$-type well region 4, which is a voltage resistant region, the p-type common potential region 61, and the first high concentration region 56. When an n-type offset region 80 is formed so as to envelop the second high concentration region 62, a drop in breakdown voltage can be suppressed. It is good when the impurity concentration of the n-type offset region 80 is between the impurity concentrations of the first high concentration region 56 and n$^-$-type well region 4. In the case of the high voltage integrated circuit device 200a too, advantages the same as those previously described are obtained.

Although not shown in the drawings, it is preferable when one more second high concentration region 62 is additionally disposed opposing the second high concentration region 62 in the end portion of the n-type well region 3, which is a high potential region, as the hole extraction advantage increases.

Figure 15B:
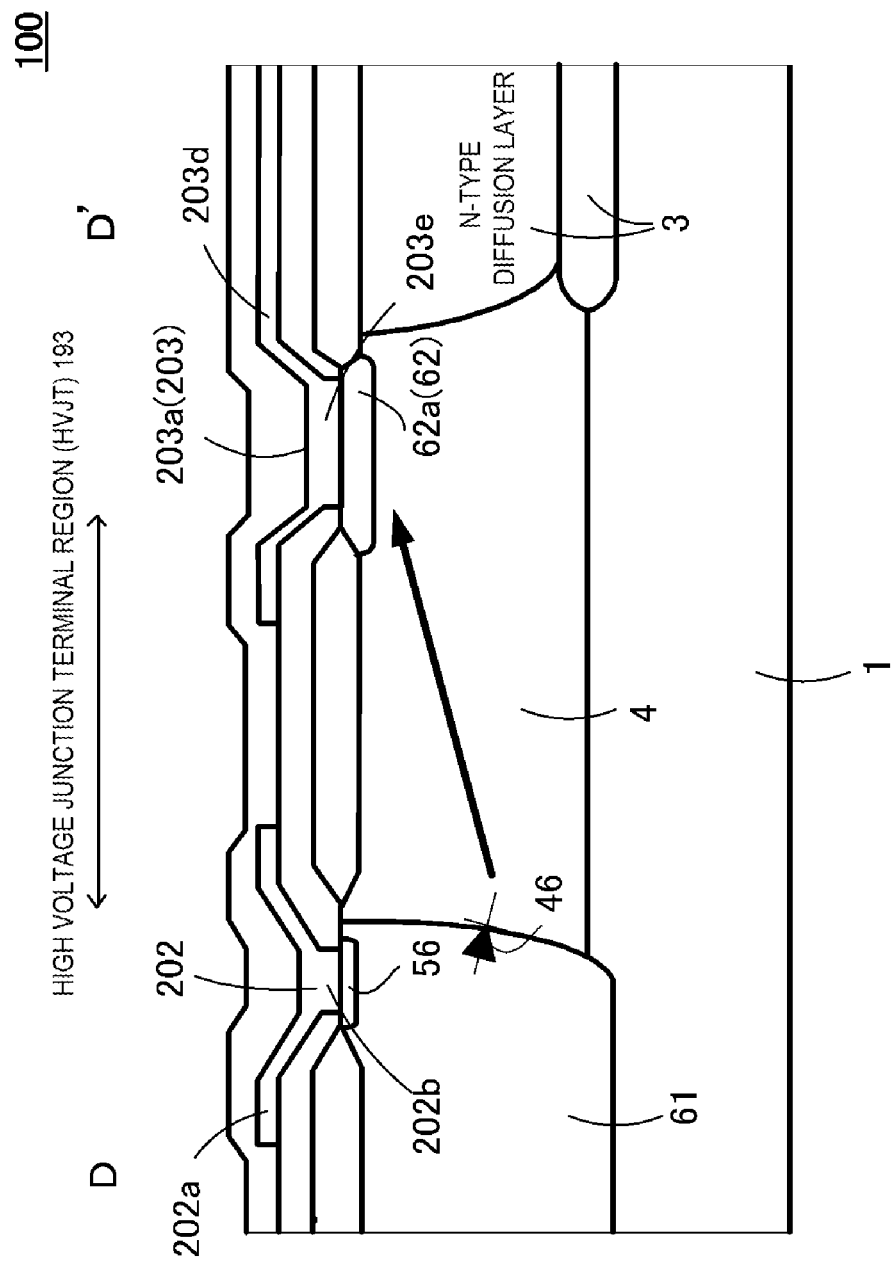

FIGS. 15A and 15B are main portion sectional views showing a modification example of the third embodiment, wherein FIG. 15A is a main portion sectional view cut along the C-C' line of FIG. 13, and FIG. 15B is a main portion sectional view cut along the D-D' line of FIG. 13.

In this example too, the p$^-$-type aperture portion 63 is formed so as to penetrate the n$^-$-type well region 4.

FIGS. 15A and 15B differ from FIGS. 14A and 14B in that the n$^-$-type well region 4 is formed of an n$^-$-type epitaxial layer formed by epitaxial growth on the p-type substrate 1, and the n-type well region (Vs reference) 3 is formed of an n$^+$-type buried layer and an n-type diffusion layer formed by diffusion from the surface of the n$^-$-type epitaxial layer. The n-type diffusion layer formed may also be formed so as to reach the p-type substrate 1 without the n$^+$-type buried layer being formed.

The advantages of the invention can also be obtained with this kind of configuration.

Figure 16A:
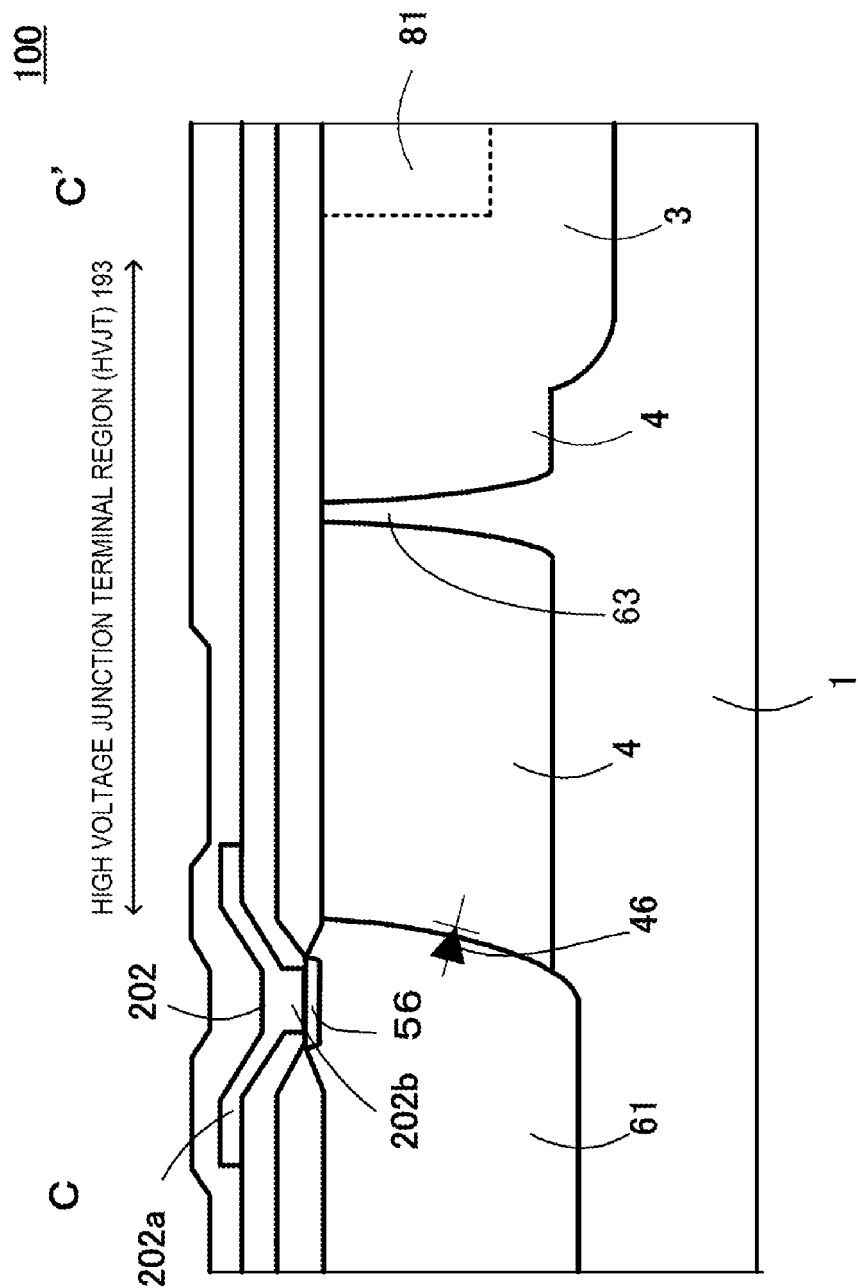
Figure 16B:
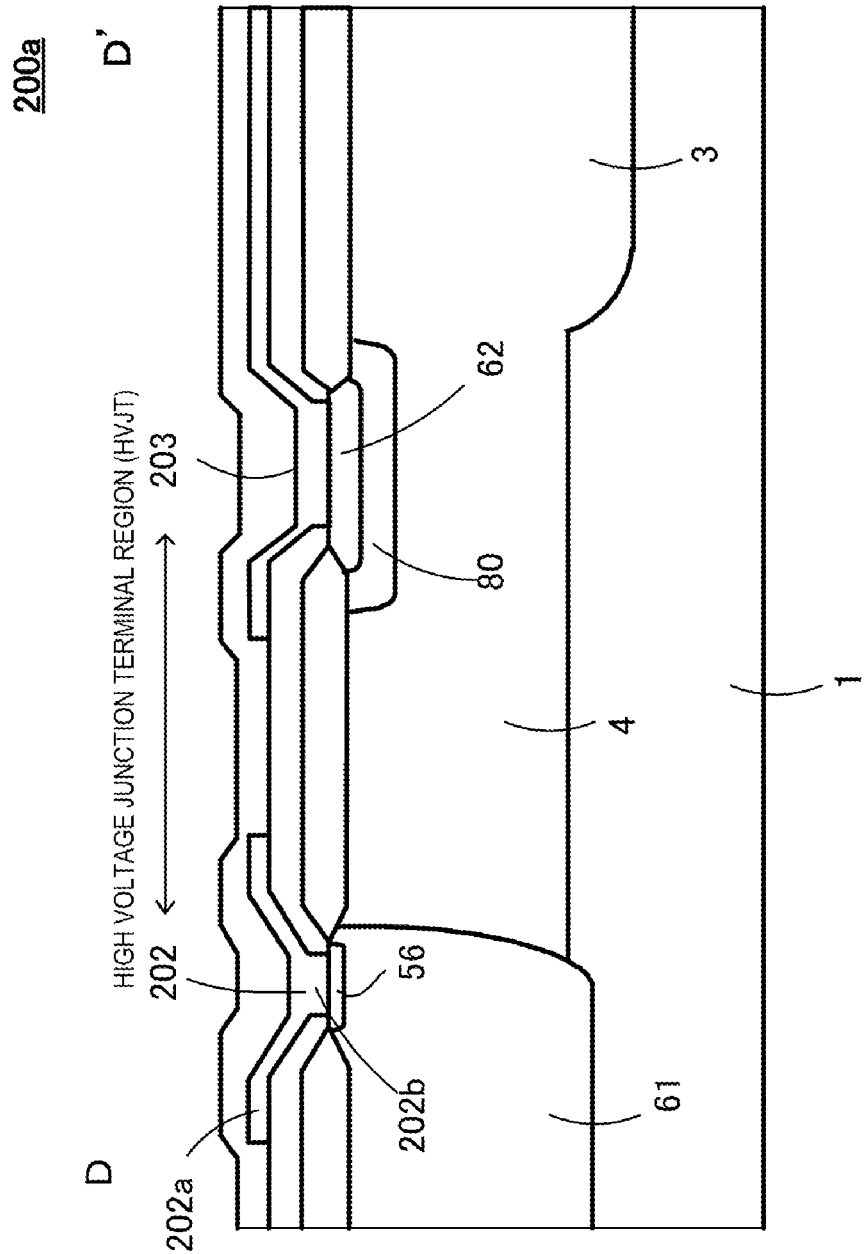

FIGS. 16A and 16B are main portion sectional views showing a modification example of the third embodiment, wherein FIG. 16A is a main portion sectional view cut along the C-C' line of FIG. 13, while FIG. 16B is a main portion sectional view cut along the D-D' line of FIG. 13.

In this example, the p-type substrate 1 is exposed, at predetermined intervals, inside the n⁻-type well region 4. The exposed portion forms the aperture portion 63. This kind of configuration can be formed by providing a mask in places that are to become the aperture portion 63 when forming the n⁻-type well region 4. Also, in FIGS. 16A and 16B, the aperture portion 63 is formed by not forming one portion of the n⁻-type well region 4, but the p-type substrate 1 may also be exposed by a formation leaving a predetermined interval so that there is one portion in which the n⁻-type well region 4 and n-type well region 3 are not connected to each other.

The advantages of the invention can also be obtained with this kind of configuration.

FIG. 17, being a main portion sectional view showing a modification example of the third embodiment, is a main portion sectional view cut along the C-C' line of FIG. 13.

FIG. 17 differs from FIGS. 16A and 16B in that a p-type diffusion layer is formed in the regions inside the n⁻-type well region 4 in which the p-type substrate 1 is exposed at predetermined intervals. The diffusion layer forms the aperture portion 63.

The advantages of the invention can also be obtained with this kind of configuration.

Embodiment 4

Figure 5:
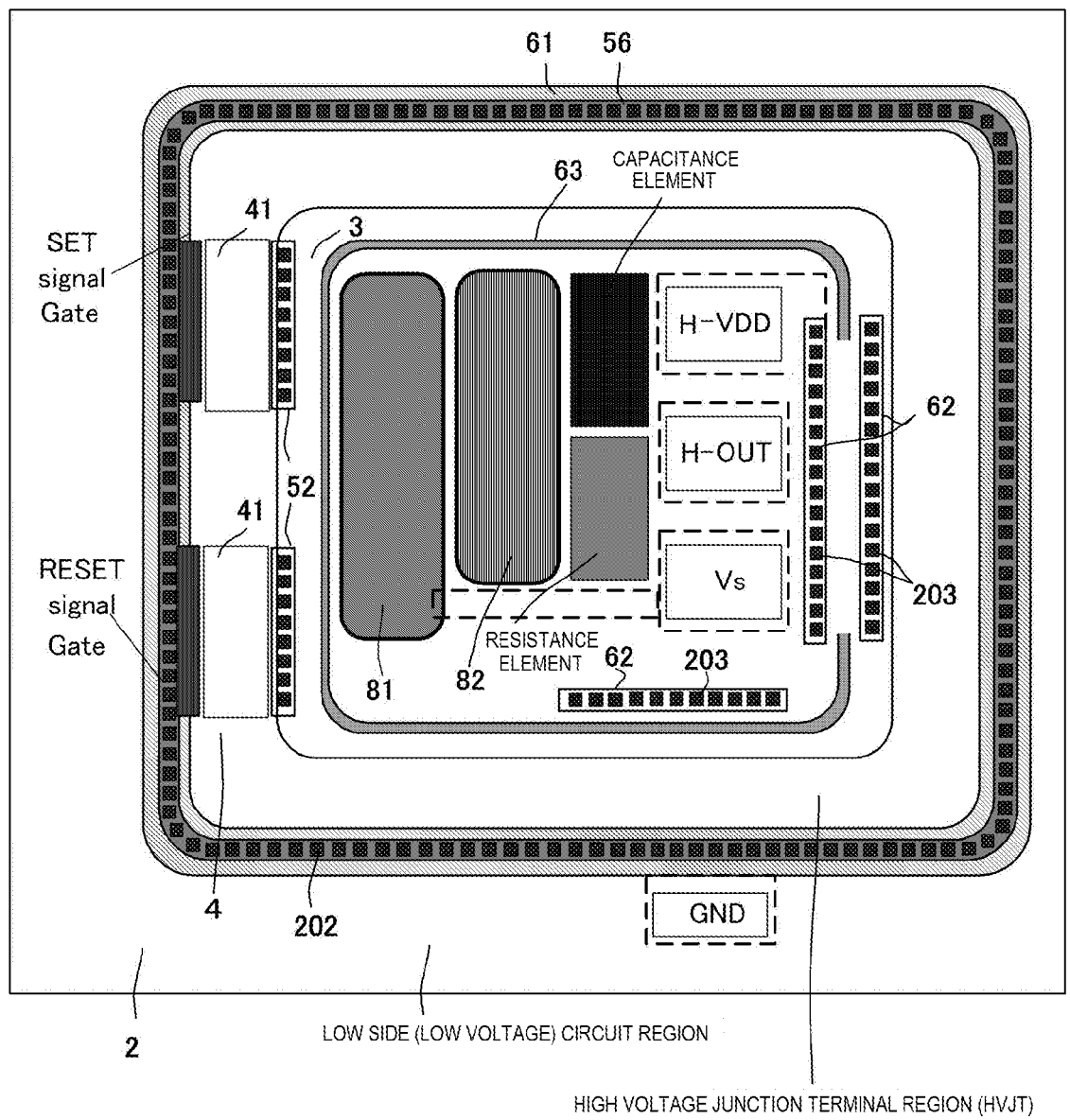
FIG. 5 is a main portion plan view of a high voltage integrated circuit device of a fourth embodiment according to the invention.

FIG. 5 is a main portion plan view of a high voltage integrated circuit device 300 of a fourth embodiment according to the invention. FIG. 5 differs from FIG. 1 in that a capacitance element (a polysilicon capacitor or MOS capacitor) and resistance element used in, for example, a filter circuit inside the high side drive circuit are collectively disposed in the n-type well region 3, which is a high potential region sandwiched between the pads (H-VDD, H-OUT, and Vs) and the H-VDD potential region 82. Therefore, the distance from the diode current implantation region to the Vs potential region 81 increases, and the amount of holes infiltrating the Vs potential region 81 can be reduced. It is also acceptable that only one of the capacitance element or polysilicon resistor is disposed.

Embodiment 5

Figure 6A:
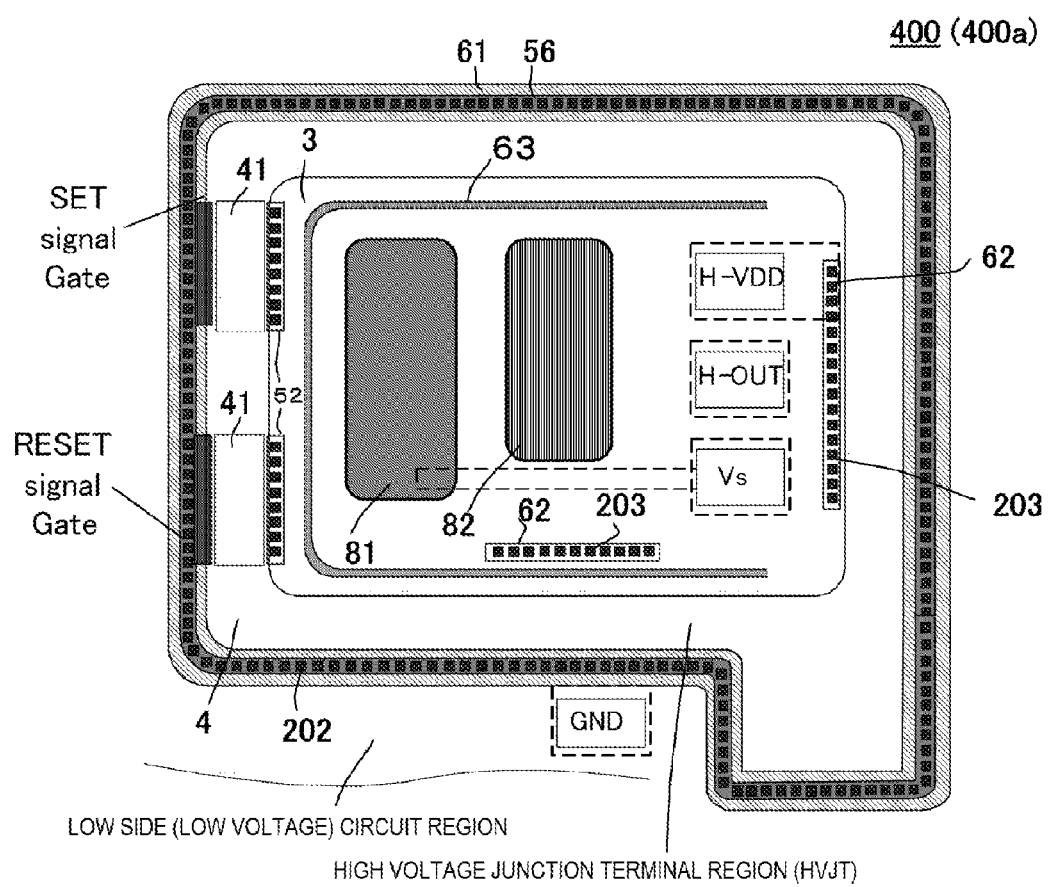
Figure 6B:
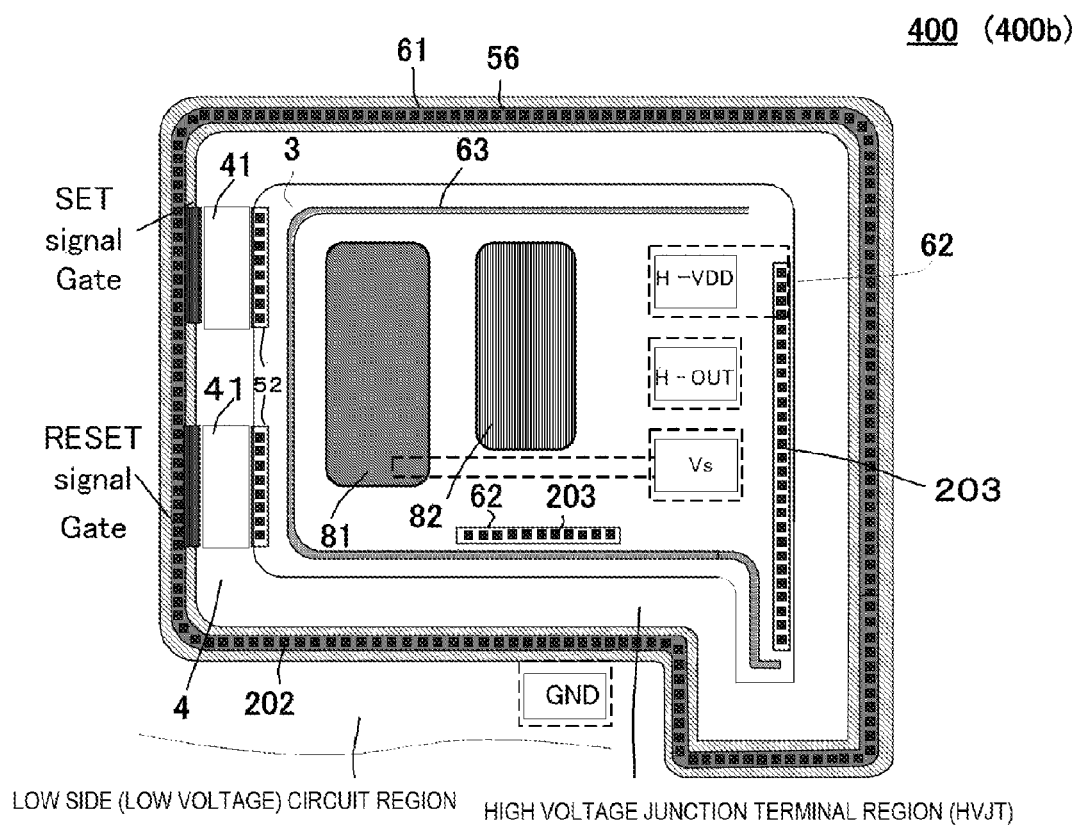

FIGS. 6A and 6B are main portion plan views of a high voltage integrated circuit device 400 of a fifth embodiment according to the invention, wherein FIG. 6A is a view when one portion of the first high concentration region 56 is protruding (400a), and FIG. 6B is a view when one portion of the first high concentration region 56 is protruding, and the p⁻-type aperture portion 63 is also protruding in that place (400b).

In FIGS. 6A and 6B, the HVJT 193 is shown with a planar form differing from that of FIG. 1. FIGS. 6A and 6B both show a case wherein the HVJT 193 has six sides rather than four sides.

In FIG. 6A, the p⁻-type aperture portion 63 is provided on three sides, while in FIG. 6B, the p⁻-type aperture portion 63 is provided on five sides. Although there is something of a difference in the amount of holes implanted into the Vs potential region inside the high side drive circuit when a negative voltage surge occurs (the implantation amount reduction advantage is greater in FIG. 6B), the same kinds of advantage are obtained in both cases.

Also, an example of fabricating using a self-isolation method whereby a diffusion layer is formed on the p-type substrate 1 is given in all of the first to fourth embodiments. Apart from this, however, the same advantages are also obtained when the n⁻-type well region 4 on the p-type substrate 1 is an n-type epitaxial layer, or when a p-type epitaxial layer is provided on the p-type substrate 1, and an n-type buried layer provided in a junction portion of the p-type epitaxial layer and p-type substrate 1.

A summary of the first to fourth embodiments is as follows. The p⁻-type aperture portion 63 enclosing the Vs potential region 81 inside the high side drive circuit, and the second pickup electrode 203 connected to the H-VDD terminal in the gap portion 63a in which the p⁻-type aperture portion 63 is not disposed, are provided. Therefore, the amount of holes implanted into the Vs potential region 81 can be suppressed even when the potential of the Vs terminal drops in a negative direction, and the n-type well region 3 in which the high side drive circuit connected to the potential of the H-VDD terminal is formed becomes transiently lower than the GND potential.

As a result of this, false signal transmission of high side logic caused by a negative voltage surge can be prevented (high side logic malfunction can be prevented) without increasing the chip area.

By the current (hole carrier implantation) flowing through the diode 46 being caused to flow through the diode current implantation region to the second high concentration region 62, the p⁻-type aperture portion 63 becomes a potential barrier, and the amount of holes transiently flowing into the Vs potential region 81 forming the high side logic can be suppressed.

Also, by the pads, capacitance element, and resistance element being collectively disposed between the Vs potential region 81 and second high concentration region 62, the amount of holes implanted from the p-type common potential region 61 into the Vs potential region 81 can be effectively suppressed using a configuration with good layout efficiency.

Therefore, the high side logic of the high side drive circuit formed in the Vs potential region 81 can be prevented from malfunctioning or breaking when negative voltage is applied to the H-VDD terminal or Vs terminal.

What is claimed is:

1. A high voltage integrated circuit device for use with a high voltage power supply to drive a high potential side power transistor that is connected in series with a low potential side power transistor, the high voltage integrated circuit device comprising:
   a second conductivity type high potential region formed in a surface layer or on the surface of a first conductivity type semiconductor layer;
   a second conductivity type voltage resistant region, formed in a surface layer or on the surface of the semiconductor layer, in contact with and enclosing the high potential region and having an impurity concentration lower than that of the high potential region;
   a first conductivity type common potential region in contact with and enclosing the voltage resistant region in a surface layer or on the surface of the semiconductor layer;
   a first conductivity type intermediate potential region formed inside the high potential region;
   a second conductivity type first high concentration region formed in a surface layer of the high potential region;

a first conductivity type second high concentration region formed in a surface layer of the common potential region;

a first pickup electrode in contact with the first high concentration region; and a second pickup electrode in contact with the second high concentration region, wherein the intermediate potential region is a circuit region formed inside the high potential region and to which is applied an intermediate potential between a high potential side potential of the high voltage power supply, which is the main circuit power supply of the high potential side and low potential side power transistors that are connected in series, and a common potential that is a low potential side potential of the high voltage power supply, wherein the high potential region is a region to which a high potential side potential of a low voltage power supply is applied with the intermediate potential as a reference, and wherein a high voltage junction terminal region is a region formed of the voltage resistant region, the common potential region, the first high concentration region, and the second high concentration region, and wherein the high voltage integrated circuit device further comprises a first conductivity type aperture portion that reaches the first conductivity type semiconductor layer from the surface of the high potential region, encloses the circuit region, and has a gap portion between opposite ends of the first conductivity type aperture portion, the first high concentration region being disposed in the voltage resistant region or high potential region between the common potential region in a location in which the gap portion is positioned and the circuit region, wherein the gap portion extends directly between the opposite ends of the first conductivity type aperture portion, is of the second conductivity type, and is part of the second conductivity type high potential region, and wherein the first high concentration region extends linearly along an entire length of the gap portion.

2. The high voltage integrated circuit device according to claim 1, wherein the aperture portion penetrates the high potential region to reach the first conductivity type semiconductor layer.

3. The high voltage integrated circuit device according to claim 2, wherein a distance from the gap portion to the intermediate potential region is 100 µm or more.

4. The high voltage integrated circuit device according to claim 1, wherein a distance from the gap portion to the intermediate potential region is 100 µm or more.

5. The high voltage integrated circuit device according to claim 1, wherein the intermediate potential region is disposed opposite the gap portion and adjacent to the aperture portion.

6. The high voltage integrated circuit device according to claim 1, wherein a pad connected to the circuit region is disposed across a dielectric on the high potential region sandwiched between the intermediate potential region and the gap portion.

7. The high voltage integrated circuit device according to claim 1, wherein, when a planar form of an end portion of the high potential region has four or more sides and corners having arc portions that connect the sides, the aperture portion is disposed along three or more sides, including one side of the end portion of the high potential region and two sides adjacent to the one side.

8. The high voltage integrated circuit device of claim 1, wherein the first conductivity type aperture portion includes a first length extending along a first side of the circuit region, a second length extending along a second side of the circuit region, and a third length extending along a third side of the circuit region, the third length located on an opposite side of the circuit region from the first length and connected to the first length by the second length, such that the first length, the second length, and the third length contiguously surround the first, second, and third sides of the circuit region, the gap portion extending linearly on the fourth side between one end and an opposite end of the first conductivity type aperture portion.

9. The high voltage integrated circuit device of claim 1, wherein the first conductivity type intermediate potential region is located between two lengths of the first conductivity type aperture portion in a first direction, and between the first conductivity type aperture portion and the gap portion in a second direction perpendicular to the first direction.

10. The high voltage integrated circuit device of claim 1, wherein the high voltage integrated circuit device further comprises:

a second conductivity type third high concentration region parallel to the first high concentration region; and a third pickup electrode in contact with the third high concentration region, and wherein the third high concentration region is located on an opposite side of the gap from the first high concentration region.

\* \* \* \* \*